US012531210B2

(12) United States Patent
Chandrashekar et al.

(10) Patent No.: US 12,531,210 B2
(45) Date of Patent: Jan. 20, 2026

(54) EDGE EXCLUSION CONTROL

(71) Applicant: Lam Research Corporation, Fremont, CA (US)

(72) Inventors: Anand Chandrashekar, Fremont, CA (US); Eric H. Lenz, Livermore, CA (US); Leonard Wai Fung Kho, San Francisco, CA (US); Jeffrey Charles Clevenger, Fremont, CA (US); In Su Ha, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 671 days.

(21) Appl. No.: 15/733,766

(22) PCT Filed: Apr. 19, 2019

(86) PCT No.: PCT/US2019/028362
§ 371 (c)(1),
(2) Date: Oct. 19, 2020

(87) PCT Pub. No.: WO2019/204754
PCT Pub. Date: Oct. 24, 2019

(65) Prior Publication Data
US 2021/0375591 A1    Dec. 2, 2021

Related U.S. Application Data

(60) Provisional application No. 62/660,872, filed on Apr. 20, 2018.

(51) Int. Cl.
*H01J 37/32* (2006.01)
*H01L 21/02* (2006.01)
*H01L 21/687* (2006.01)

(52) U.S. Cl.
CPC .. *H01J 37/32449* (2013.01); *H01J 37/32642* (2013.01); *H01J 37/32715* (2013.01);
(Continued)

(58) Field of Classification Search
None
See application file for complete search history.

(56) References Cited

U.S. PATENT DOCUMENTS 3,408,097 A    10/1968 Glasgow
5,080,933 A    1/1992 Grupen-Shemansky et al.
(Continued)

FOREIGN PATENT DOCUMENTS

CN    1930322 A    3/2007
CN    201075384 Y    6/2008
(Continued)

OTHER PUBLICATIONS

English Machine Translation of JPH11219918 Ikeda retrieved from ESPACENET on Nov. 8, 2023 (Year: 2023).*
(Continued)

*Primary Examiner* — Parviz Hassanzadeh
*Assistant Examiner* — Laureen Chan
(74) *Attorney, Agent, or Firm* — Weaver Austin Villeneuve & Sampson LLP

(57) ABSTRACT

Provided herein are methods and apparatuses for controlling uniformity of processing at an edge region of a semiconductor wafer. In some embodiments, the methods include exposing an edge region to treatment gases such as etch gases and/or inhibition gases. Also provided herein are exclusion ring assemblies including multiple rings that may be implemented to provide control of the processing environment at the edge of the wafer.

17 Claims, 19 Drawing Sheets

(52) U.S. Cl.
CPC .. *H01L 21/02175* (2013.01); *H01L 21/02186* (2013.01); *H01L 21/68721* (2013.01); *H01L 21/68735* (2013.01); *H01J 2237/332* (2013.01)

(56) References Cited

U.S. PATENT DOCUMENTS

| | | | |
|---|---|---|---|
| 5,304,248 | A | 4/1994 | Cheng et al. |
| D351,459 | S | 10/1994 | Andersson |
| 5,476,548 | A | 12/1995 | Lei et al. |
| D368,516 | S | 4/1996 | Matsumura |
| 5,552,124 | A | 9/1996 | Su |
| 5,769,951 | A | 6/1998 | Van De Ven et al. |
| 5,810,931 | A | 9/1998 | Stevens et al. |
| 5,848,889 | A | 12/1998 | Tietz et al. |
| 6,001,183 | A | 12/1999 | Gurary et al. |
| 6,040,011 | A * | 3/2000 | Yudovsky ......... H01L 21/68792 |
| | | | 118/728 |
| 6,048,403 | A | 4/2000 | Deaton et al. |
| 6,096,135 | A | 8/2000 | Guo et al. |
| 6,126,382 | A | 10/2000 | Scales et al. |
| 6,143,082 | A | 11/2000 | McInerney et al. |
| 6,159,299 | A | 12/2000 | Koai et al. |
| 6,280,183 | B1 | 8/2001 | Mayur et al. |
| 6,296,712 | B1 * | 10/2001 | Guo ................. C23C 16/45521 |
| | | | 118/500 |
| 6,343,784 | B1 | 2/2002 | Jourde et al. |
| 6,350,320 | B1 | 2/2002 | Sherstinsky et al. |
| 6,374,512 | B1 | 4/2002 | Guo et al. |
| D536,071 | S | 1/2007 | Wortmann et al. |
| D560,660 | S | 1/2008 | Brassard |
| D614,272 | S | 4/2010 | Henry et al. |
| D631,948 | S | 2/2011 | Yoshida et al. |
| D638,522 | S | 5/2011 | Yoshida et al. |
| D723,239 | S | 2/2015 | Raschke et al. |
| D754,308 | S | 4/2016 | Nakagawa |
| D767,233 | S | 9/2016 | Raschke et al. |
| D783,922 | S | 4/2017 | Kirkland |
| 9,738,975 | B2 | 8/2017 | Gomm et al. |
| 9,870,917 | B2 | 1/2018 | Kang et al. |
| 10,062,598 | B2 | 8/2018 | Ngo et al. |
| 10,242,848 | B2 | 3/2019 | Jeon et al. |
| D846,095 | S | 4/2019 | Copeland et al. |
| D846,097 | S | 4/2019 | Copeland |
| D852,336 | S | 6/2019 | Copeland |
| D888,903 | S | 6/2020 | Gunther et al. |
| D893,684 | S | 8/2020 | Matthys et al. |
| D895,075 | S | 9/2020 | Kang et al. |
| D895,076 | S | 9/2020 | Kuroda et al. |
| D898,170 | S | 10/2020 | Yoshida et al. |
| D917,026 | S | 4/2021 | Pacheco et al. |
| D917,825 | S | 4/2021 | Kirkland |
| 11,018,045 | B2 | 5/2021 | Seo et al. |
| 11,098,406 | B2 | 8/2021 | Jeon et al. |
| D939,694 | S | 12/2021 | Hokans |
| D986,394 | S | 5/2023 | Weih et al. |
| 11,830,759 | B2 | 11/2023 | Janicki et al. |
| 11,837,495 | B2 | 12/2023 | Janicki et al. |
| D1,013,841 | S | 2/2024 | Cosley et al. |
| D1,055,006 | S | 12/2024 | Nallagonda et al. |
| D1,066,609 | S | 3/2025 | Svanstroem et al. |
| D1,071,887 | S | 4/2025 | Yoshida et al. |
| 12,400,902 | B2 | 8/2025 | Janicki et al. |
| D1,093,328 | S | 9/2025 | Suzuki |
| D1,095,472 | S | 9/2025 | Suzuki et al. |
| 2001/0042514 | A1 * | 11/2001 | Mizuno ................. C23C 16/54 |
| | | | 118/728 |
| 2003/0030235 | A1 | 2/2003 | Cipolla et al. |
| 2004/0020599 | A1 * | 2/2004 | Tanaka ............. C23C 16/45521 |
| | | | 257/E21.17 |
| 2005/0196971 | A1 * | 9/2005 | Sen ..................... C23C 16/4585 |
| | | | 438/778 |
| 2005/0245005 | A1 | 11/2005 | Benson |
| 2006/0145428 | A1 | 7/2006 | Dudman |
| 2007/0173059 | A1 | 7/2007 | Young et al. |
| 2007/0235660 | A1 | 10/2007 | Hudson |
| 2008/0289766 | A1 | 11/2008 | Heemstra et al. |
| 2011/0263123 | A1 | 10/2011 | Gomi et al. |
| 2012/0018940 | A1 | 1/2012 | Kumnig et al. |
| 2012/0213500 | A1 | 8/2012 | Koelmel et al. |
| 2013/0000558 | A1 * | 1/2013 | Hara .................... C23C 16/4412 |
| | | | 118/724 |
| 2013/0171822 | A1 | 7/2013 | Chandrashekar et al. |
| 2013/0269737 | A1 | 10/2013 | Mizuno |
| 2013/0302980 | A1 | 11/2013 | Chandrashekar et al. |
| 2014/0113458 | A1 | 4/2014 | Pan et al. |
| 2014/0235063 | A1 | 8/2014 | McMillin et al. |
| 2014/0261187 | A1 | 9/2014 | Krishnan et al. |
| 2014/0273460 | A1 | 9/2014 | Reyland et al. |
| 2014/0335698 | A1 | 11/2014 | Singh et al. |
| 2015/0020736 | A1 | 1/2015 | Pan et al. |
| 2015/0047564 | A1 | 2/2015 | Kim |
| 2015/0187620 | A1 | 7/2015 | Gurary et al. |
| 2015/0221539 | A1 | 8/2015 | Ouye |
| 2016/0002778 | A1 | 1/2016 | Ravi et al. |
| 2016/0024650 | A1 * | 1/2016 | Toyoda ............... C23C 16/4408 |
| | | | 118/704 |
| 2016/0177444 | A1 | 6/2016 | Baldasseroni et al. |
| 2016/0289827 | A1 | 10/2016 | Augustyniak et al. |
| 2016/0307742 | A1 * | 10/2016 | Mishra .............. H01J 37/32642 |
| 2016/0355928 | A1 | 12/2016 | Toriya et al. |
| 2017/0002465 | A1 | 1/2017 | Shaikh et al. |
| 2017/0218517 | A1 | 8/2017 | Fukiage et al. |
| 2017/0278681 | A1 | 9/2017 | Qi et al. |
| 2018/0053660 | A1 | 2/2018 | Jandl et al. |
| 2018/0090344 | A1 * | 3/2018 | Kim .................. H01J 37/32642 |
| 2018/0112309 | A1 * | 4/2018 | Kamio ............. C23C 16/45544 |
| 2018/0122685 | A1 | 5/2018 | Breiling et al. |
| 2018/0138074 | A1 | 5/2018 | Lee et al. |
| 2018/0277431 | A1 | 9/2018 | Chandrashekar et al. |
| 2019/0062918 | A1 | 2/2019 | Shaikh et al. |
| 2019/0145001 | A1 | 5/2019 | Park et al. |
| 2019/0153592 | A1 | 5/2019 | Bois et al. |
| 2019/0228952 | A1 | 7/2019 | Dorf et al. |
| 2020/0035787 | A1 | 1/2020 | Wang et al. |
| 2020/0202291 | A1 | 6/2020 | Yamamoto et al. |
| 2020/0234981 | A1 | 7/2020 | Schmid et al. |
| 2020/0234996 | A1 | 7/2020 | Rokkam et al. |
| 2020/0248307 | A1 | 8/2020 | Gurary et al. |
| 2021/0062325 | A1 | 3/2021 | Ramalingam et al. |
| 2021/0141312 | A1 | 5/2021 | Nakiboglu et al. |
| 2021/0202217 | A1 | 7/2021 | Lim et al. |
| 2022/0108912 | A1 | 4/2022 | Janicki et al. |
| 2022/0115261 | A1 | 4/2022 | Janicki et al. |
| 2022/0259731 | A1 | 8/2022 | Tsuji |
| 2022/0293398 | A1 | 9/2022 | Jeong et al. |
| 2022/0415711 | A1 | 12/2022 | Liu et al. |
| 2023/0040885 | A1 | 2/2023 | Gulabal et al. |
| 2023/0238223 | A1 | 7/2023 | Linebarger et al. |
| 2024/0055293 | A1 | 2/2024 | Janicki et al. |
| 2025/0014938 | A1 | 1/2025 | Chandrashekar et al. |
| 2025/0087465 | A1 | 3/2025 | Ko |
| 2025/0283221 | A1 | 9/2025 | Huang et al. |

FOREIGN PATENT DOCUMENTS

| | | | | |
|---|---|---|---|---|
| EP | 1719167 | B1 | | 10/2011 |
| JP | S59132623 | A | | 7/1984 |
| JP | H04268724 | A | | 9/1992 |
| JP | H0537960 | U | | 5/1993 |
| JP | H0881775 | A | | 3/1996 |
| JP | H08227857 | A | | 9/1996 |
| JP | H0917747 | A | | 1/1997 |
| JP | 09082653 | A * | 3/1997 | ....... C23C 16/45521 |
| JP | H10298767 | A | | 11/1998 |
| JP | 11219918 | A * | 8/1999 | |
| JP | H11219918 | A | | 8/1999 |
| JP | 2000054137 | A | | 2/2000 |
| JP | 2000290774 | A | | 10/2000 |
| JP | 2001329370 | A | | 11/2001 |
| JP | 2001527285 | A | | 12/2001 |
| JP | 2002110652 | A | | 4/2002 |
| JP | 2002518601 | A | | 6/2002 |
| JP | 2002190466 | A | | 7/2002 |
| JP | 2002246370 | A | | 8/2002 |

(56) References Cited

FOREIGN PATENT DOCUMENTS

| | | | |
|---|---|---|---|
| JP | 2002363756 A | * | 12/2002 |
| JP | 2003027242 A | | 1/2003 |
| JP | 2003524703 A | | 8/2003 |
| JP | 2006502016 A | | 1/2006 |
| JP | 2008072122 A | | 3/2008 |
| JP | 2010045200 A | | 2/2010 |
| JP | 2011035026 A | | 2/2011 |
| JP | 2015536048 A | | 12/2015 |
| JP | 2016530705 A | | 9/2016 |
| KR | 970052044 A | | 7/1997 |
| KR | 20040094240 A | | 11/2004 |
| KR | 20060036846 A | | 5/2006 |
| KR | 20070031785 A | | 3/2007 |
| KR | 20110135631 A | | 12/2011 |
| KR | 20140045806 A | * 4/2014 ....... H01L 21/67017 |
| KR | 20150138675 A | | 12/2015 |
| KR | 20160029073 A | | 3/2016 |
| KR | 20160075351 A | | 6/2016 |
| KR | 20160117261 A | | 10/2016 |
| KR | 20180053258 A | | 5/2018 |
| KR | 101937692 B1 | | 1/2019 |
| KR | 20190051291 A | | 5/2019 |
| KR | 20190056021 A | | 5/2019 |
| KR | 20200000460 A | | 1/2020 |
| KR | 20200038317 A | | 4/2020 |
| KR | 20200135554 A | | 12/2020 |
| TW | 452838 B | | 9/2001 |
| TW | 201401428 A | | 1/2014 |
| TW | D160525 S | | 5/2014 |
| TW | 201546937 A | | 12/2015 |
| TW | 201701318 A | | 1/2017 |
| TW | 201742948 A | | 12/2017 |
| TW | 201920750 A | | 6/2019 |
| TW | 202002126 A | | 1/2020 |
| TW | D207742 S | | 10/2020 |
| WO | WO-2014209489 A1 | | 12/2014 |
| WO | WO-2019204754 A1 | | 10/2019 |
| WO | WO-2019204754 A9 | | 1/2020 |
| WO | WO-2021146352 A1 | | 7/2021 |
| WO | WO-2021179000 A1 | | 9/2021 |

OTHER PUBLICATIONS

English Machine translation of JP2002363756 Akiyama retrieved from ESPACENET on Nov. 8, 2023 (Year: 2023).*
English Machine translation of JP-09082653-A Katsumata et al. retrieved from ESPACENET on Nov. 14, 2023 (Year: 2023).*
English Machine Translation of Lee (KR101937692B1 equivalent to KR20140045806A) retrieved from ESPACENET Jun. 20, 2024 (Year: 2024).*
"Over." Merriam-Webster.com Dictionary, Merriam-Webster, https://www.merriam-webster.com/dictionary/over. Accessed Jun. 21, 2024. (Year: 2024).*
"Inlet." Merriam-Webster.com Dictionary, Merriam-Webster, https://www.merriam-webster.com/dictionary/inlet. Accessed Jun. 21, 2024. (Year: 2024).*
International Preliminary Report on Patentability and written opinion dated Aug. 25, 2022 in Application PCT/US2021/015487.
International Search Report and Written Opinion dated Oct. 13, 2021, in application No. PCT/US2021/038210.
International Preliminary Report on Patentability dated Oct. 29, 2020 in PCT Application PCT/US2019/028362.
International Preliminary Report on Patentability dated Jul. 28, 2022 in PCT Application No. PCT/US2021/013327.
International Search Report & Written Opinion dated Aug. 9, 2019 in PCT Application PCT/US2019/028362.
International Search Report and Written Opinion dated Apr. 29, 2021 in PCT Application No. PCT/US2021/013327.
International Search Report and Written Opinion dated May 20, 2021 in PCT Application No. PCT/US2021/015487.
KR Office Action dated Sep. 2, 2022, in Application No. KR10-2022-7024631 with English translation.
KR Office Action dated Sep. 26, 2022 in Application No. KR10-2022-7001497.
KR Office Action dated Sep. 26, 2022 in Application No. KR10-2022-7001591.
KR Office Action dated Apr. 3, 2022, in Application No. KR10-2022-7001497 with English translation.
KR Office Action dated Apr. 3, 2022, in Application No. KR1020227001591 with English translation.
KR Office Action dated Jul. 26, 2022, in Application No. KR10-2022-7024631.
KR Office Action dated Mar. 18, 2016 in KR Application No. 10-2012-0004935.
KR Search Report dated Jul. 25, 2022, in Application No. KR10-2022-7024631.
TW Search Report & Grant Decision dated Jan. 25, 2015 in TW Application No. 102116792.
U.S. Final office Action dated Jun. 28, 2022 in U.S. Appl. No. 17/644,754.
U.S. Advisory Action dated Nov. 1, 2022, in U.S. Appl. No. 17/644,757.
U.S. Corrected Notice of Allowance dated Nov. 3, 2022 in U.S. Appl. No. 17/644,754.
U.S. Corrected Notice of Allowance dated Sep. 28, 2022 in U.S. Appl. No. 17/644,754.
U.S. Final Office Action dated Jul. 27, 2022, in U.S. Appl. No. 17/644,757.
U.S. Notice of Allowance dated Sep. 16, 2022 in U.S. Appl. No. 17/644,754.
US Office Action dated Feb. 15, 2022 in U.S. Appl. No. 17/644,754.
US Office Action dated Mar. 17, 2022 in U.S. Appl. No. 17/644,757.
U.S. Appl. No. 17/758,797, inventors Gulabal et al., filed Jul. 13, 2022.
U.S. Appl. No. 29/864,203, inventors Huang et al., filed May 13, 2022.
International Preliminary Report on Patentability dated Jan. 5, 2023 in PCT Application No. PCT/US2021/038210.
International Preliminary Report on Patentability dated Sep. 1, 2022, in PCT Application No. PCT/US2021/018347.
International Search Report and Written Opinion dated Apr. 4, 2023 in Application No. PCT/US2022/080276.
International Search Report and Written Opinion dated Jun. 8, 2021 in PCT Application No. PCT/US2021/018347.
JP Office Action dated May 30, 2023 in Application No. JP 2020-557974 with English translation.
KR Office Action dated Feb. 21, 2023, in Application No. KR10-2022-7024631 with English translation.
KR Office Action dated Mar. 28, 2023, in Application No. KR 10-2022-7001591 with English translation.
KR Office Action dated Mar. 28, 2023, in Application No. KR10-2022-7001497 with English translation.
KR Office Action dated Sep. 26, 2022 in Application No. KR10-2022-7001497 with English translation.
KR Office Action dated Sep. 26, 2022 in Application No. KR10-2022-7001591 with English translation.
TW Office Action dated Dec. 13, 2022 in Application No. TW108113695 with English translation.
U.S. Advisory Action dated Jun. 27, 2023, in U.S. Appl. No. 17/644,757.
U.S. Final Office Action dated Apr. 5, 2023 in U.S. Appl. No. 17/644,757.
U.S. Non-Final office Action dated Jan. 12, 2023 in U.S. Appl. No. 17/644,754.
U.S. Non-Final Office Action dated Dec. 14, 2022 in U.S. Appl. No. 17/644,757.
U.S. Notice of Allowance dated May 5, 2023 in U.S. Appl. No. 17/644,754.
U.S. Appl. No. 18/002,614, inventors Linebarger et al., filed Dec. 19, 2022.
CN Office Action dated Jul. 6, 2023, in application No. CN202230757795.6 with English translation.
International Search Report and Written Opinion dated Sep. 4, 2023 in PCT Application No. PCT/US2023/021778.

(56) References Cited

OTHER PUBLICATIONS

JP Office Action dated Mar. 10, 2023 in Application No. JP2022-24512 with English Translation.
KR Office Action dated Jul. 27, 2023, in Application No. KR10-2022-7024631 with English Translation.
KR Office Action dated Jun. 21, 2023, in Application No. KR30-2022-0046450 with English translation.
KR Office Action dated Jun. 21, 2023, in Application No. KR30-2022-0046451 with English translation.
TW Office Action dated Jul. 31, 2023 in Application No. TW111305554 with English Translation.
U.S. Notice of Allowance dated Aug. 10, 2023 in U.S. Appl. No. 17/644,754.
U.S. Notice of Allowance dated Jul. 20, 2023, in U.S. Appl. No. 17/644,757.
U.S. Notice of Allowance dated Jul. 31, 2023 in U.S. Appl. No. 17/644,754.
U.S. Notice of Allowance dated Sep. 12, 2023 in U.S. Appl. No. 17/644,757.
CN Office Action dated Jan. 8, 2024 in CN Application No. 202230757795.6 with English Translation.
KR Office Action dated Feb. 15, 2024 in KR Application No. 10-2023-7025656 with English translation.
KR Office Action dated Jan. 22, 2024 in KR Application No. 10-2020-7033442 with English Translation.
KR Office Action dated Jul. 26, 2022, in Application No. KR10-2022-7024631 with English translation.
KR Office Action dated Oct. 31, 2023, in Application No. KR10-2022-7001591 with English Translation.
TW Office Action dated Dec. 7, 2023, in TW application No. 111305560 with English translation.
TW Office Action dated Dec. 15, 2023 in TW Application No. 111305554 with English Translation.
U.S. Notice of Allowance dated Nov. 3, 2023 in U.S. Appl. No. 17/644,754.
CN Office Action dated Dec. 4, 2024 in CN Application No. 201980036351.9, with English Translation.
JP Office Action dated Oct. 8, 2024 in JP Application No. 2022-547668 with English translation.
KR Office Action dated Nov. 28, 2024 in KR Application No. 10-2023-7025656, with English Translation.
KR Office Action dated Sep. 26, 2024 in KR Application No. 10-2020-7033442 with English Translation.
TW Office Action dated Oct. 14, 2024 in TW Application No. 110105760 with English translation.
U.S. Final Office Action dated Nov. 20, 2024 in U.S. Appl. No. 18/494,756.
U.S. Appl. No. 18/863,615, inventors Huang Y, et al., filed Nov. 6, 2024.
CN Office Action dated May 24, 2024 in CN Application No. 201980036351.9 with English translation.
CN Office Action dated May 31, 2024 in CN Application No. 202230757795.6, with English Translation.
International Preliminary Report on Patentability and Written Opinion dated Jun. 6, 2024 in PCT Application No. PCT/US2022/080276.
TW Office Action dated Apr. 15, 2024 in TW Application No. 111305560, with English Translation.
TW Office Action dated May 23, 2024 in TW Application No. 110104695 with English translation.
U.S. Non-Final Office Action dated May 24, 2024 in U.S. Appl. No. 18/494,756.
U.S. Appl. No. 18/712,211, inventor Chandrashekar A, filed May 21, 2024.
KR Search Report dated Jul. 25, 2022, in Application No. KR10-2022-7024631 with English Translation.
TW Office Action dated Jul. 26, 2024 in TW Application No. 111305554 with English translation.
TW Office Action dated Sep. 2, 2024 in TW Application No. 110101601 with English translation.
U.S. Final Office Action dated Jun. 27, 2024 in U.S. Appl. No. 15/733,766.
Decision from the Korean Patent Court in KR application 10-2022-7001591, decided Jan. 24, 2025, dismissing Appeal against the Decision of the IPTAB upholding Final Rejection by the KIPO (translation appended).
JP Office Action dated Apr. 8, 2025 in JP Application No. 2022-547668, with English Translation.
JP Office Action dated Apr. 1, 2025 in JP Application No. 2022579931, with English Translation.
JP Office Action dated Feb. 4, 2025 in JP Application No. 2022-542659, with English Translation.
SG Search Report and Written Opinion dated Jan. 13, 2025 in SG Application No. 11202251271Q.
SG Search Report and Written Opinion dated Jan. 29, 2025 in SG Application No. 11202251767J.
U.S. Corrected Notice of Allowance dated Feb. 28, 2025 in U.S. Appl. No. 18/494,756.
U.S. Non-Final Office Action dated Mar. 11, 2025 in U.S. Appl. No. 17/758,797.
U.S. Notice of Allowance dated Feb. 5, 2025 in U.S. Appl. No. 18/494,756.
Canova K L., et al., "Using Metal Precursors to Passivate Oxides for Area Selective Deposition," JVSTA, vol. 41 (3), May 2023, pp. 003407-1-9.
JP Office Action dated Jul. 29, 2025 in JP Application No. 2022-542659, with English Translation.
KR Decision to Grant and Search Report dated May 26, 2025 in KR Application No. 10-2020-7033442, with English translation.
Prosini P P., et al., "Effect of Substrate Surface Treatment on the Nucleation and Crystal Growth of Electrodeposited Copper and Copper-indium Alloys," Thin Solid Films, Apr. 1997, vol. 298 (1-2), pp. 191-196.
SG Written Opinion dated Jun. 24, 2025 in SG Application No. 11202252343J.
U.S. Final Office Action dated Jun. 17, 2025 in U.S. Appl. No. 18/002,614.
U.S. Notice of Allowance dated Jul. 30, 2025 in U.S. Appl. No. 17/904,703.
U.S. Notice of Allowance dated May 20, 2025 in U.S. Appl. No. 18/494,756.
U.S. Restriction Requirement dated Jun. 26, 2025 in U.S. Appl. No. 29/864,203.
U.S. Restriction Requirement dated May 9, 2025 in U.S. Appl. No. 17/904,703.
KR Office Action dated Oct. 22, 2025 in KR Application No. 10-2022-7032885, with English Translation.
KR Office Action dated Sep. 24, 2025 in KR Application No. 10-2022-7028430, with English Translation.
KR Office Action dated Sep. 26, 2025 in KR Application No. 10-2023-7025656, with English Translation.
TW Office Action and Search Report dated Oct. 23, 2025 in TW Application No. 114114114, with English Translation.
U.S. Final Office Action dated Sep. 17, 2025 in U.S. Appl. No. 17/758,797.
U.S. Non-Final Office Action dated Oct. 21, 2025 in U.S. Appl. No. 29/864,203.

\* cited by examiner

Nucleation Layer Full Deposition

Wafer edge treatment

CVD full dep

Nucleation Layer Full Deposition

Wafer edge treatment

CVD full dep

EDGE EXCLUSION CONTROL

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

A challenge in semiconductor processing is achieving process uniformity across as large an expanse of a processed wafer as possible. Managing the semiconductor processing environment at the edge regions of a semiconductor wafer presents particular challenges. In particular, the discontinuities at the edge regions can make uniform processing difficult. Further, the edge regions provide a fluid flow passage to the underside of the semiconductor. This allows process gasses access to the underside of the semiconductor wafer, where unwanted processing may occur.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure may be implemented in an apparatus including an exclusion ring assembly configured for use in processing of a semiconductor wafer of nominal diameter D, the exclusion ring assembly comprising: an upper annular ring having an inner diameter smaller than D and an outer diameter; and a lower annular ring having an inner diameter smaller than D and outer diameter, wherein the upper annular ring is disposed over the lower annular ring to define an annular gas flow passage between the upper annular ring and the lower annular ring.

In some embodiments, the annular gas flow passage has an inner diameter, and an outer diameter, and a width defined by the gap between the upper annular ring and the lower annular ring, and wherein the width at the inner diameter of the annular gas flow passage is less than the width at the outer diameter of the annular gas flow passage.

In some embodiments, the gap between the upper annular ring and the lower annular ring at the inner diameter of lower annular ring is the smaller than the gap between the upper annular ring and the lower annular ring at the outer diameter of the lower ring.

In some embodiments, the gap between the upper annular ring and the lower annular ring at the inner diameter of lower annular ring is no more than 0.1 inch.

In some embodiments, the inner diameter of the upper annular ring is smaller than the inner diameter of the lower annular ring.

In some embodiments, the upper annular ring includes a top surface that is substantially parallel to a reference plane perpendicular to a center axis of the upper annular ring. In some such embodiments, the upper annular ring further comprises an inner edge and a sloped surface that extends from the inner edge to the top surface. In some such embodiments, the lower annular ring includes a top surface that is substantially parallel to a reference plane perpendicular to a center axis of the lower annular ring. In some such embodiments, the upper annular ring further includes an inner edge and a sloped surface that extends from the inner edge to the top surface. In some such embodiments, the slope of the sloped surface of the upper annular ring is greater than the slope of the sloped surface of the lower annular ring.

In some embodiments, the apparatus further includes a pedestal configured to support the semiconductor wafer, the pedestal including a gas injector configured to inject gas at an edge region of the wafer.

In some embodiments, the apparatus further includes a pedestal supporting the exclusion ring structure, the pedestal including a top surface and recess in the top surface defining a gas passage.

In some embodiments, the recess is a distance Y from the center of the pedestal, the distance Y being greater than the inner radius of the lower annular ring.

Aspects of the disclosure may be implemented a deposition chamber including: a pedestal comprising a top surface and a annular recess in the top surface configured to be fluidically connected to a backside gas source; an exclusion ring assembly installed on the pedestal, wherein the exclusion ring assembly comprises an upper annular ring having an inner diameter and an outer diameter, wherein the upper annular ring is disposed over the lower annular ring to define a lower annular gas flow passage between the upper annular ring and the lower annular ring; and a showerhead disposed over the pedestal and exclusion ring assembly to define an upper annular flow gas flow passage between the showerhead and the upper annular ring.

Aspects of the disclosure may be implemented in a method including providing a circular wafer on the pedestal in the deposition chamber including an exclusion ring assembly described herein, the circular wafer having a nominal diameter D, wherein D is greater than the inner diameters of the upper and lower annular rings and wherein the exclusion ring assembly is disposed over the outer edge of the circular wafer; providing, through the showerhead, a radial flow of a process gas over the circular wafer; and providing a backside gas to the edge of the circular wafer through the annular recess in the pedestal.

In some embodiments, the method further includes depositing uniform film from the process gas from the center of the circular wafer to at least 2 mm or at least 1 mm from the edge of the circular wafer.

Another aspect of the disclosure may be implemented in a method including selectively exposing an edge region of a wafer to a gas including a deposition inhibitor; and exposing the top surface and edge region of the wafer to a deposition gas to deposit a film on the top surface.

In some embodiments, deposition on the edge region is inhibited such that the film is selectively deposited on the top surface. In some embodiments, the film is uniform to within 2 mm of the edge of the wafer. In some embodiments, the film is uniform to within 1 mm of the edge of the wafer.

In some embodiments, the selective exposure to the deposition inhibitor and the exposure to the deposition gas are performed at the same time. In some embodiments, the selective exposure to the deposition inhibitor is performed before the exposure to the deposition gas.

In some embodiments, the method further includes depositing a first film on the top surface and the edge region prior to selectively exposing the edge region of the wafer to the gas including a deposition inhibitor. In some embodiments, the film is a tungsten-containing film and the deposition inhibitor is a nitrogen-containing compound.

In some embodiments, selectively exposing an edge region of a wafer to a gas including a deposition inhibitor comprises exposing a titanium nitride (TiN) to the gas. In some embodiments, the wafer is disposed on a pedestal and the edge region is disposed under an edge exclusion ring installed on the pedestal. In some embodiments, the method includes selectively exposing an edge region of a wafer to a gas including a deposition inhibitor comprise inletting a gas through the pedestal to the edge region.

In some such embodiments, transitioning from selectively exposing the edge region of the wafer to the gas including a deposition inhibitor to exposing the top surface and edge region of the wafer to the deposition gas to deposit the film on the top surface includes increasing a distance between the exclusion ring and the wafer.

In some embodiments, the method further includes repeating selectively exposing an edge region of a wafer to a gas including a deposition inhibitor; and exposing the top surface and edge region of the wafer to a deposition gas to deposit a film on the top surface.

Another aspect of the disclosure may be implemented in a method including depositing a nucleation layer on a top surface and at least a portion of a bevel of a wafer; selectively treating the bevel of the wafer; and depositing a bulk layer across the wafer but not on the bevel.

In some embodiments, selectively treating the bevel includes selectively inhibiting nucleation on the bevel. In some such embodiments, selectively treating the bevel includes selectively etching the nucleation layer on the bevel. In some embodiments, the nucleation layer and the bulk layer are tungsten-containing films.

Another aspect of the disclosure may be implemented in a method including flowing a process gas including a deposition gas over a wafer top surface and past the wafer edge; flowing a treatment gas past the wafer edge; and flowing a process gas including a deposition gas over a wafer top surface and past the wafer edge to deposit a film on the top surface but on the wafer edge.

In some embodiments, flowing a process gas includes pulling a vacuum on the backside of the wafer. In some embodiments, the process gas is flowed with an edge exclusion ring shielding the wafer edge in a raised position. In some such embodiments, the treatment gas is flowed with the edge exclusion ring a lowered position.

Another aspect of the disclosure relates to a method including exposing the top surface and edge region of the wafer to a deposition gas to deposit a uniform film on the top surface; and exposing an edge region of a wafer to a gas including an etchant.

Another aspect of the disclosure relates to a method of a manufacturing an exclusion ring assembly for use in processing a semiconductor substrate having a nominal diameter D. The method may involve forming a green body and firing it to form a ceramic body, which may be ground as appropriate to form the exclusion ring assembly. In some embodiments, the exclusion ring assembly may include an upper annular ring having an inner diameter smaller than D and an outer diameter; and a lower annular ring having an inner diameter smaller than D and outer diameter, wherein the upper annular ring is disposed over the lower annular ring to define an annular gas flow passage between the upper annular ring and the lower annular ring. The upper annular ring and the lower annular ring may be formed as separate components that can be attached or as a single piece. According to various embodiments, the exclusion ring assembly may be manufactured from a ceramic, such as aluminum oxide ($Al_2O_3$) or aluminum nitride (AlN). Also provided are methods of manufacturing a pedestal including an exclusion ring assembly. The methods may involve manufacturing an exclusion ring assembly and attaching or otherwise disposing the exclusion ring assembly on the pedestal surface.

These and other aspects are described below with reference to the Drawings.

DETAILED DESCRIPTION

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the disclosure and the appended claims. In the following description, numerous specific details are set forth in order to provide a thorough understanding the disclosed subject matter. Various implementations of subject may be practiced without some or all of these specific details. In other instances, well-known process operations have not been described in detail in order not to unnecessarily obscure the subject matter described herein.

Provided herein are methods and apparatuses for controlling uniformity of processing at an edge region of a semiconductor wafer. In some embodiments, the methods include exposing an edge region to treatment gases such as etch gases and/or inhibition gases. Also provided herein are exclusion ring assemblies including multiple rings that may be implemented to provide control of the processing environment at the edge of the wafer.

Implementations of the methods herein are performed using exclusion rings during semiconductor processing. An exclusion ring (also referred to as a minimum overlap exclusion ring or MOER) installed on a wafer support can be used to manage gas flow and process environments along the edge of a wafer. An example of an exclusion ring that may be used in implementations of the methods described herein is described below with reference to FIGS. 1A-1E.

Figure 1A:
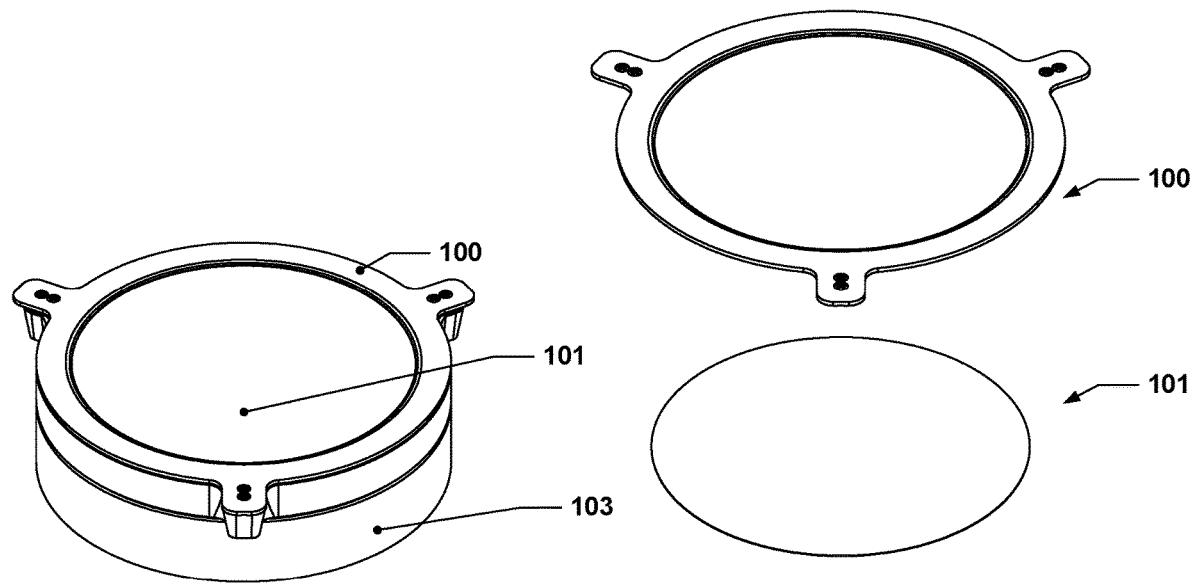
FIG. 1A depicts an isometric view of an example of an exclusion ring installed on a wafer support that may be used in implementations of the disclosure.
Figure 1B:
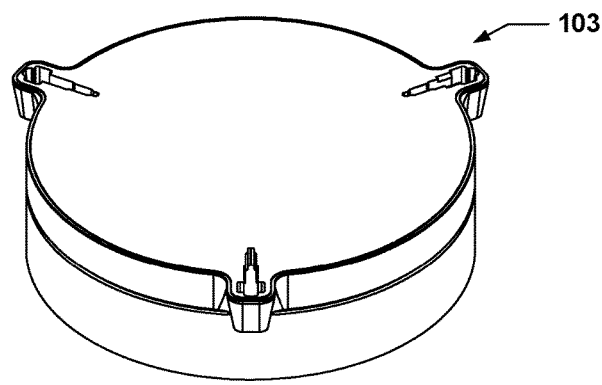
FIG. 1B shows an exploded isometric view of an example of an exclusion ring, wafer, and wafer support that may be used in implementations of the disclosure.

In FIG. 1A, an isometric view of an exclusion ring installed on a wafer support is depicted. An exclusion ring 100 may be used to manage gas flow and process environments along the edge of a wafer 101, which may be supported by a wafer support 103. FIG. 1B shows an exploded isometric view of the exclusion ring 100, the wafer 101, and wafer support 103.

Figure 1C:
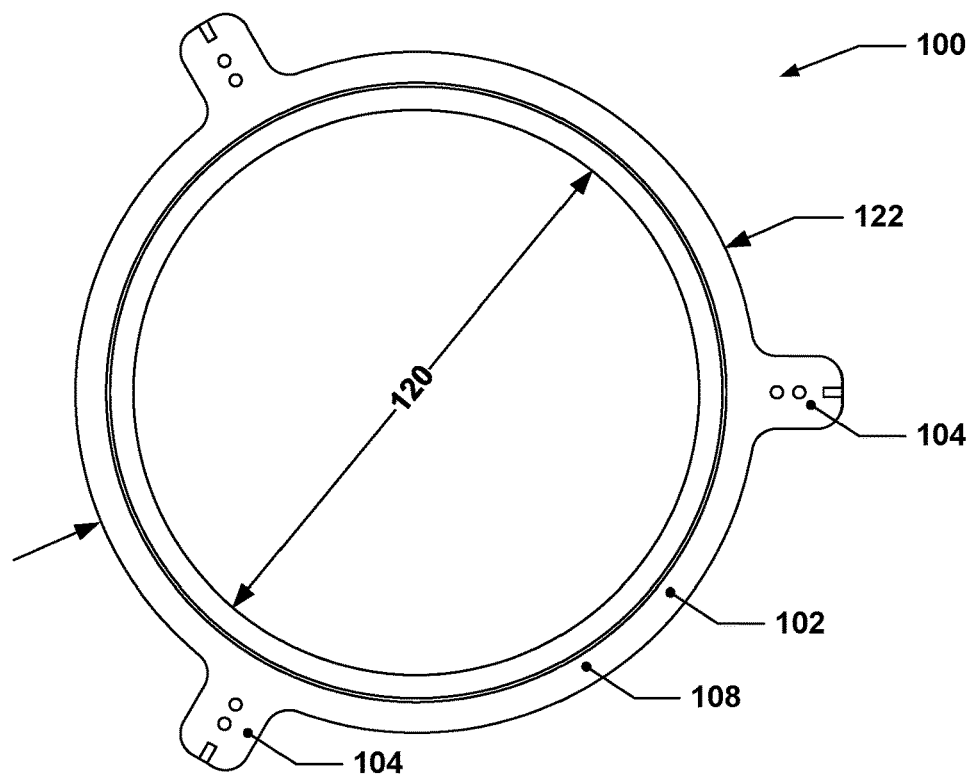
FIGS. 1C and 1D show bottom and top views, respectively of an example of an exclusion ring that may be used in implementations of the disclosure.
Figure 1D:
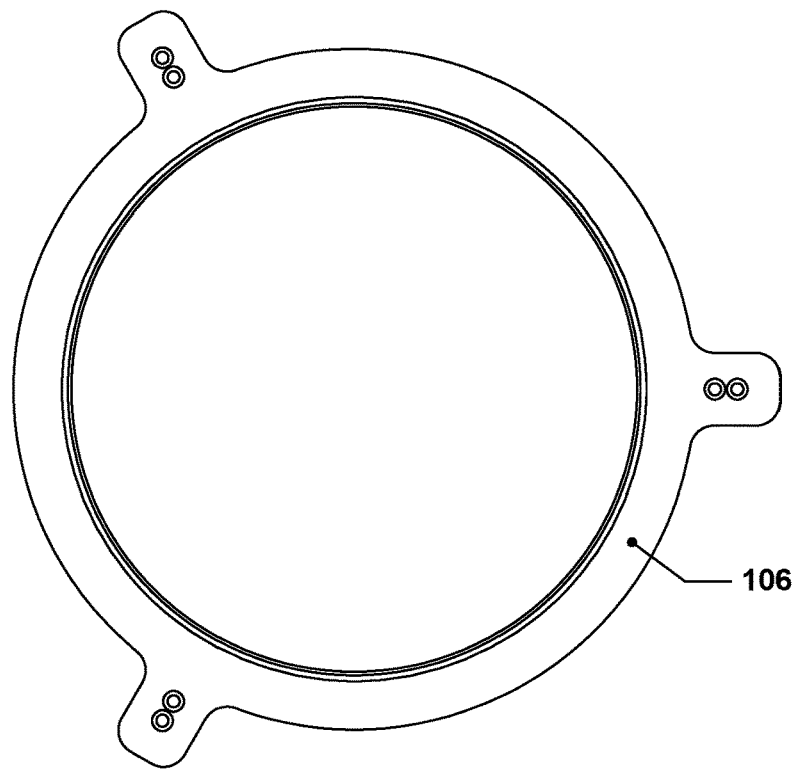

FIGS. 1C and 1D show bottom and top views, respectively, of an exclusion ring. The exclusion ring 100 may be broadly described as a thin, annular ring with an inner diameter 120 and an outer diameter 122. The exclusion ring 100 may, in some implementations, include a plurality of tabs 104 that project from the outer perimeter of the annular ring 102 in a radial direction. The top surface 106 and bottom surface 108, which may also be referred to herein as first and second surfaces, respectively, of the exclusion ring 100 may be substantially parallel to a reference plane that is perpendicular to the center axis of the annular ring. It is to be recognized that the terms "top" and "bottom," with respect to exclusion rings, are relative terms that, in the context of this application, refer to the surfaces of the exclusion rings that appear to be "top" and "bottom" when the exclusion rings are in use in a semiconductor processing environment rather than an arbitrary top and bottom defined by the orientation of the exclusion rings at any given instant. Moreover, there may be portions of the top surface 106 and the bottom surface 108 that are not parallel to the reference plane. For example, the bottom surface 108 of the exclusion ring 100 may feature a recess that allows the exclusion ring 100 to be placed over a semiconductor wafer without resting on the semiconductor wafer such that the depth of the recess may be larger than the nominal thickness of the semiconductor wafer. The inner diameter 122 of the exclusion ring 100 may be smaller than the nominal diameter of the semiconductor wafer such there may be some amount of radial overlap of the semiconductor wafer and the exclusion ring 100, e.g., between 0.05" and 0.5", when in use in the methods described herein. The recess may be contained within an intermediate diameter larger than the nominal diameter of the semiconductor wafer. The portion of the bottom surface 108 where the transition to the recess occurs may be sloped and, thus, the transition portion may represent a limited region where the bottom surface is not parallel to the reference plane. As a whole, however, the top surface 106 and the bottom surface 108 may be substantially parallel to the reference plane—such that most of radial distances of the surfaces are parallel to the reference plane. The top surface 106 and the bottom surface 108 may be offset from each other a distance greater than the nominal thickness of the semiconductor wafer.

Figure 1E:
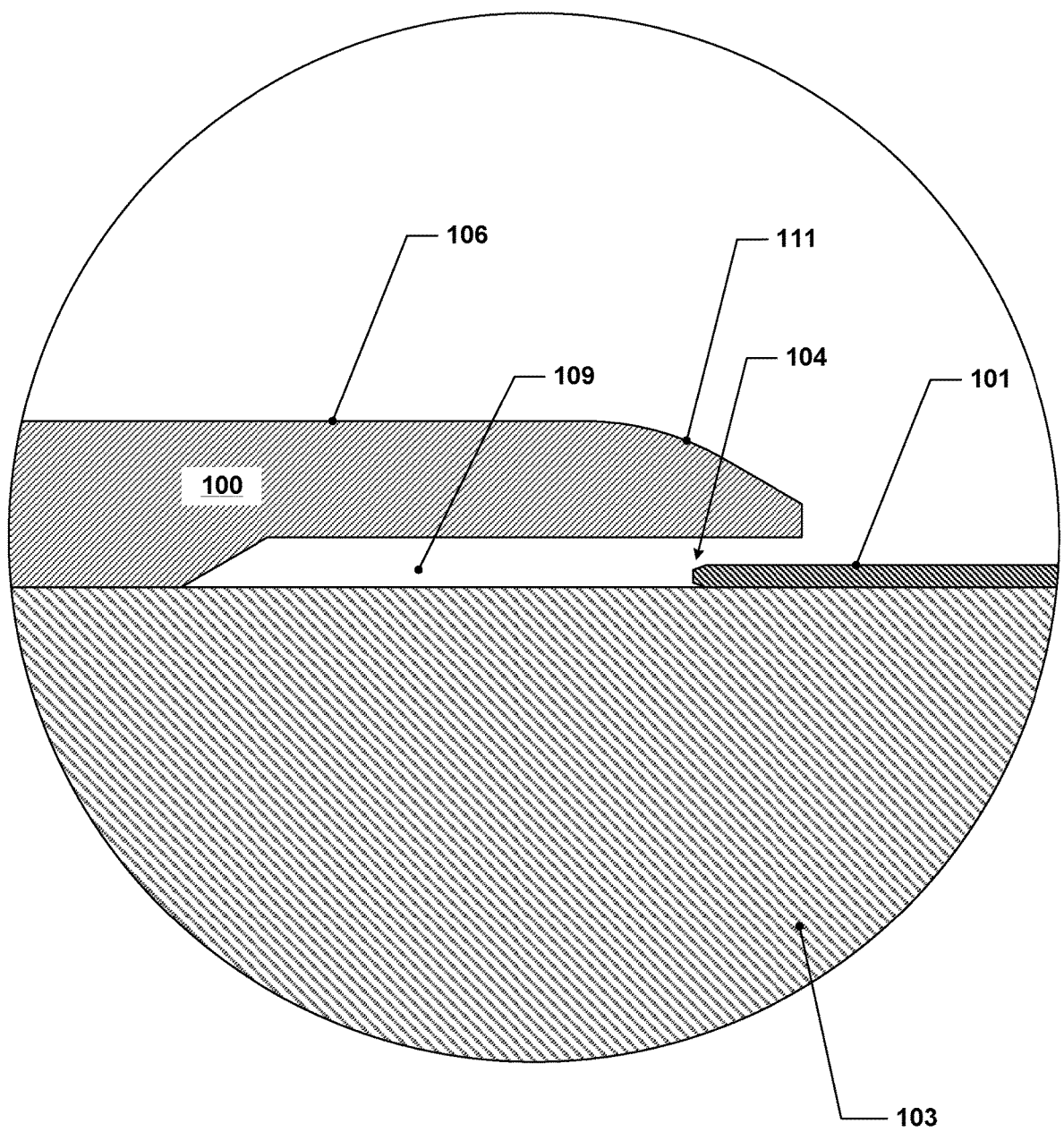
FIG. 1E shows enlarged cross-sectional detail view of an exclusion ring and wafer that may be used in implementations of the disclosure.

The top surface 106 of the exclusion ring 100 may include a sloped portion, as shown in FIG. 1E, which shows an example of an enlarged cross-sectional detail view of the edges of the wafer 103 and the exclusion ring 100. As shown, the top surface 106 includes a sloped portion 111. The wafer 103 is disposed in a recess 109 of the exclusion ring 100 such that the edge 104 of the wafer is disposed directly under the exclusion ring 100. The edge 104 of the wafer 101 is a bevel edge, such that it slopes from the horizontal top surface of the wafer. Deposition of materials on the bevel may be avoided, while maintaining good uniformity on the horizontal top surface. For example, following deposition of a relatively thick (e.g., 2000 Å) film such as tungsten, a chemical-mechanical planarization (CMP) process may be performed to planarize the film. Avoiding deposition on a bevel edge is useful because the deposition on a bevel is not removed by planarization.

Figure 2:
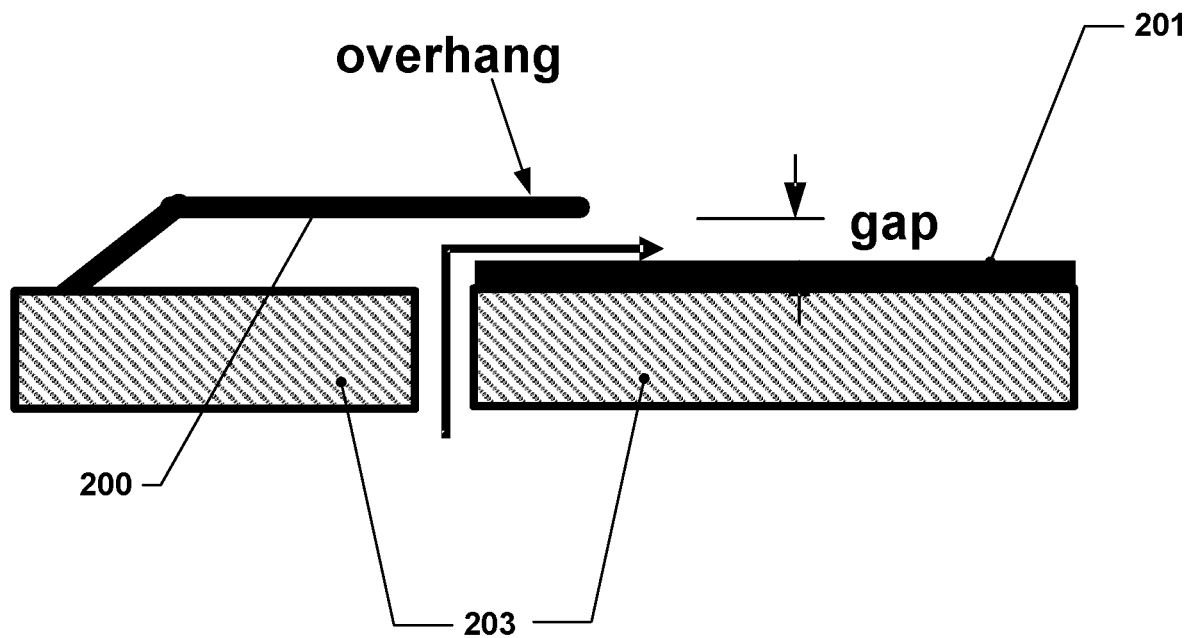
FIG. 2 shows a schematic illustration of an example arrangement of a pedestal including backside gas injection and an exclusion ring that may be used in implementations of the disclosure.

In deposition of a material, such as tungsten, an exclusion ring can be used to modulate deposition at the wafer edge. FIG. 2 shows a schematic illustration of a pedestal (or other wafer support) including backside gas injection and an exclusion ring. A backside gas such argon (Ar) and/or hydrogen ($H_2$) can be flowed to prevent deposition gases (e.g., tungsten hexafluoride/hydrogen ($WF_6/H_2$) or tungsten chloride/hydrogen ($WCl_x/H_2$)) from reaching the edge of a wafer 201. An exclusion ring 200 prevents backside deposition by directing the flow of the backside gas at the edge of the wafer 201 in the volume created by the exclusion ring 200, wafer support 203, and wafer 201. As shown in FIG. 2, the exclusion ring 200 extends over the wafer 201 with a gap between the top of the wafer 201 and the exclusion ring 200. One or more of the overhang, the gap, as well as the gap between the exclusion ring 200 and the showerhead (not shown) and the flow rate and type of backside gas may be modulated to control the deposition profile at the edge.

Figure 3:
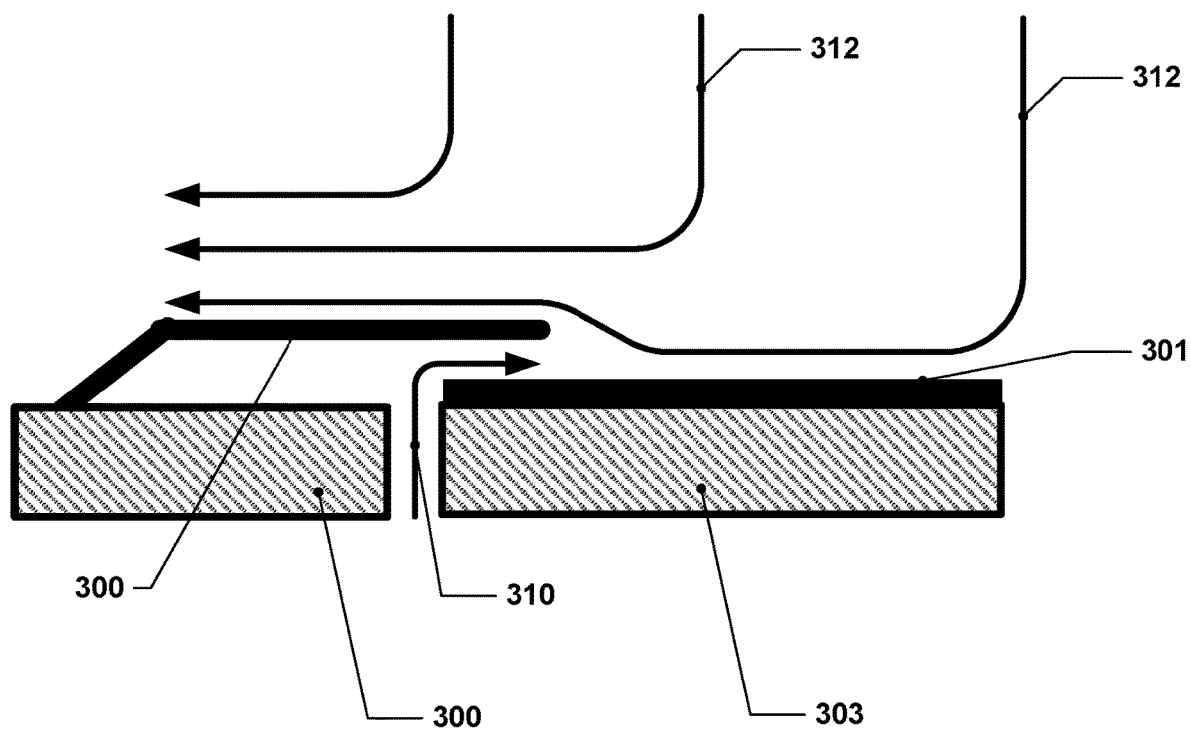
FIG. 3 shows a schematic illustration of process gas and backside gas streamlines during deposition using an example arrangement of a pedestal including backside gas injection and an exclusion ring.

In one example illustrated in FIG. 3, in deposition of tungsten (W), the Ar/$H_2$ flow as indicated by streamline 310 under an exclusion ring 300 pushes back the deposition gas (e.g., $WF_6/H_2$ or $WCl_x/H_2$) preventing it from reaching the edge of a wafer 301 and thus preventing deposition of tungsten at the edge. The profile of the exclusion ring 300 causes the streamlines 312 of gas flow from the showerhead that are traveling radial out above the wafer to bend up around the ring. This bending up lowers the concentration of $WF_6$ or other tungsten precursor gas close to the wafer's surface by the ring.

The technique depicted in FIG. 3 is effective to exclude tungsten deposition on the wafer bevel while providing uniform deposition up to 3 mm to the edge. That is, for a 300 mm wafer (radius of 150 mm), the technique illustrated in FIG. 3 provides uniform W deposition from 0 to 147 mm from the wafer center, while preventing deposition on the bevel edge.

Figure 4A:
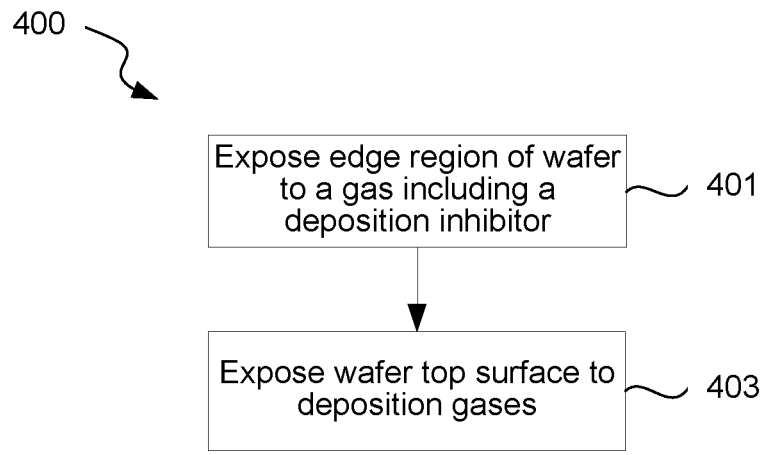
FIGS. 4A and 4B are process flow diagrams showing certain operations in examples of methods of modulating deposition at the edge of a wafer according to implementations of the disclosure.
Figure 4B:
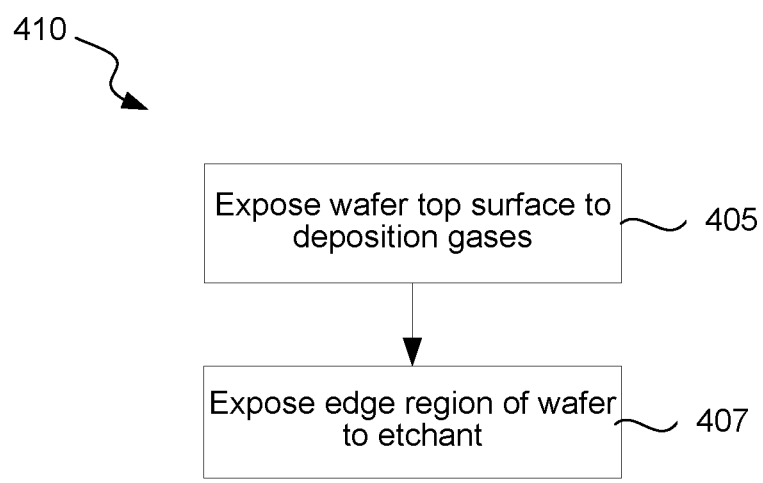

FIGS. 4A and 4B are flow diagrams showing certain operations in modulating deposition at the edge of a wafer. In particular embodiments, deposition at the edge is inhibited and/or removed, while providing uniform deposition up to a certain distance from the edge, including up to 2 mm from the edge or up to or 1 mm from the edge. That is, for a 300 mm wafer, uniform deposition from 0 to 148 nm (2 mm from edge) or 0 to 149 mm (1 mm from edge) from the wafer center, while preventing deposition on the bevel edge, may be provided. Other values within the range of 1 mm-3 mm from the edge may be implemented using the methods and apparatus described herein. According to various embodiments, the methods may be used to provide a thickness non-uniformity of less than 1% across the wafer up to the certain distance, where the non-uniformity is measured as 100% times (half of the maximum deviation in thickness (tmax−tmin) divided by the average thickness).

First, in FIG. 4A, a method 400 may be used to inhibit deposition on the bevel edge. An edge region of the wafer is exposed to a gas including a deposition inhibitor. (401). For deposition of tungsten or tungsten-containing films, the deposition inhibitor may be a nitrogen-containing compound such as nitrogen ($N_2$), ammonia ($NH_3$), or hydrazine ($N_2H_4$). The inhibition may be a plasma or thermal (non-plasma) process. Ammonia or hydrazine may be used for thermal processes. In some embodiments, the thermal inhibition processes are performed at temperatures ranging from 250° C. to 450° C. At these temperatures, exposure of a previously formed tungsten nucleation layer to $NH_3$ results in an inhibition effect. Other potentially inhibiting chemistries such as nitrogen ($N_2$) or hydrogen ($H_2$) may be used for thermal inhibition at higher temperatures (e.g., 900° C.). For many applications, however, these high temperatures exceed the thermal budget. Hydrogen-containing nitriding agents such as ammonia and hydrazine may be used at lower temperatures appropriate for back end of line (BEOL) applications.

In some embodiments, inhibition can involve a chemical reaction between the inhibitor species and the feature surface to form a thin layer of a compound material such as silicon nitride (SiN) or involve a surface effect such as adsorption that passivates the Si or other surface without forming a layer of a compound material. In some embodiments, a thin tungsten layer may be present on the bevel surface and form a tungsten nitride layer.

In some embodiments, the inhibition treatment may be applied after before or after deposition of a nucleation layer or a bulk layer on the wafer. For example, it may be performed on a wafer that includes a barrier layer (e.g., a titanium nitride (TiN) or tungsten nitride (WN) layer) on an exposed surface, a tungsten nucleation layer, or a tungsten bulk layer.

The top surface of the wafer is exposed to deposition gases. (403). Deposition may be by an atomic layer deposition (ALD) or chemical vapor deposition (CVD) method, for example. In the former, the wafer is exposed to alternating pulses of reactant gases. In the example of tungsten deposition, a tungsten-containing precursor such as tungsten hexafluoride, ($WF_6$), tungsten hexachloride ($WCl_6$), tungsten pentachloride ($WCl_5$), tungsten hexacarbonyl ($W(CO)_6$), or a tungsten-containing organometallic compound may be used. In some embodiments, pulses of the tungsten-containing precursor are pulsed with a reducing agent such as hydrogen ($H_2$), diborane ($B_2H_6$), silane ($SiH_4$), or germane ($GeH_4$). In a CVD method, the wafer is exposed to the reactant gases simultaneously.

Because the bevel edge has been passivated, in some embodiments, the film does not deposit there even if some of the deposition gases reach it. In some embodiments, a film may deposit but to lesser extent than on the top surface of the wafer. Block 403 may take place after block 401 or it may partially or fully overlap with block 401.

In FIG. 4B, a method 410 may be used to etch film deposited on a bevel edge. Block 405 involves exposing the top surface of the wafer to reactant gases to deposit a film. Deposition may be an ALD or CVD method, for example. The edge region of the wafer is exposed to etchant. (407). For example, to etch tungsten film, nitrogen trifluoride ($NF_3$) or molecular fluorine ($F_2$) may be used. Block 407 may take place after block 405 or it may partially or fully overlap with block 405.

In some embodiments, a method may include edge inhibition, uniform top surface deposition, and edge etching. Any of these operations or the entire cycle may be repeated one or more times to achieve a desired profile.

Figure 5A:
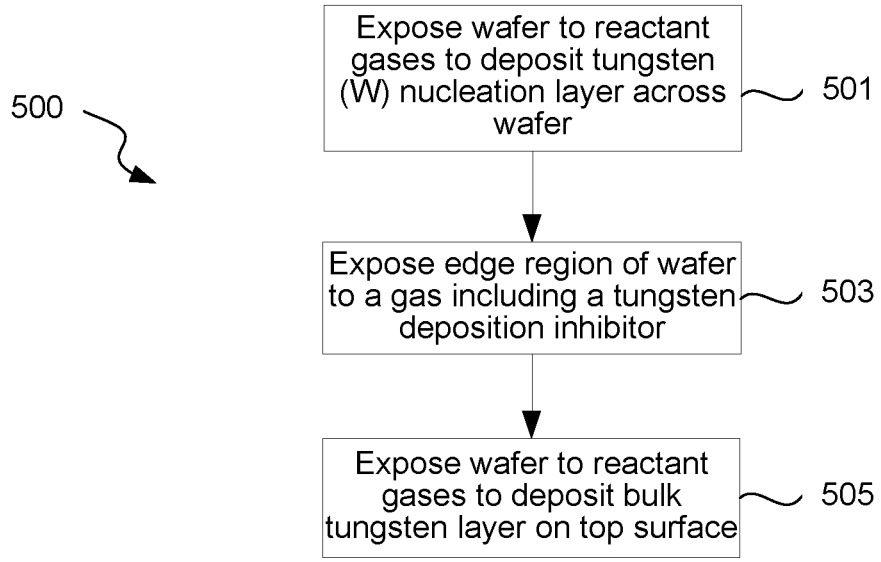
FIGS. 5A and 5B are process flow diagrams showing certain operations in examples of methods of deposition of a tungsten (W) or W-containing film according to implementations of the disclosure.
Figure 5B:
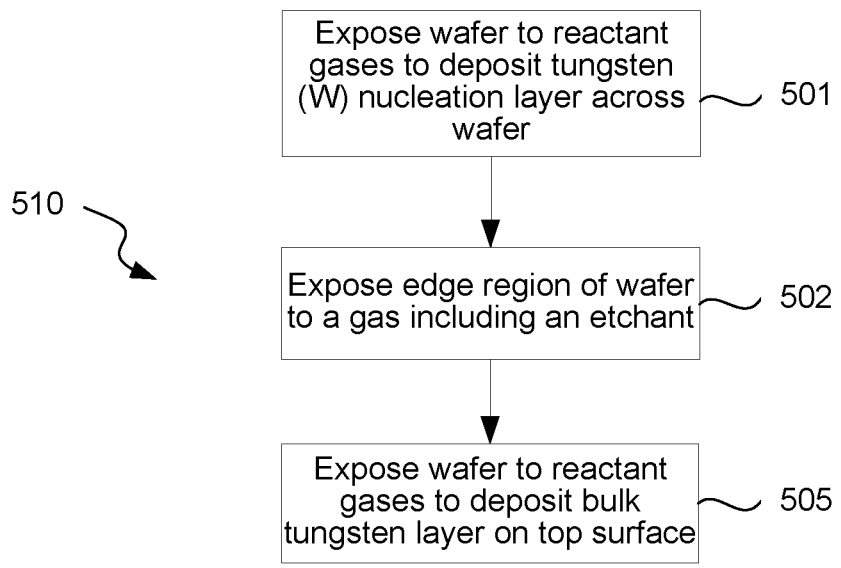

FIGS. 5A and 5B show methods of deposition of a tungsten (W) or W-containing film. First, in FIG. 5A, in a method 500, the wafer is exposed to reactant gases to deposit a W nucleation layer across the wafer. (501). Deposition of a W nucleation layer is described below and may involve a pulsed nucleation layer (PNL) or atomic layer deposition (ALD) process. In some embodiments, during this stage, there is deposition on the bevel edge of the wafer. There is also uniform deposition across the wafer. According to various embodiments, the uniform deposition may go to at least a threshold distance from the edge, e.g., from the wafer center to out to at least 2 mm from the wafer edge (1.7 mm from a 0.3 mm bevel) or to out to at least 1 mm from the wafer edge (0.7 mm from a 0.3 mm bevel).

The nucleation layer is thin, e.g., on the order of 10 Å-100 Å on the top surface of the wafer. Deposition on the bevel edge, if present, may be uniform or discontinuous. The edge region of the wafer is then exposed to a gas including an inhibition chemistry. (503). Inhibition of tungsten nucleation is described further below. The flow of the inhibition gas is controlled such that the top surface of the wafer is not exposed to the inhibition chemistry. Techniques to control the gas are described further below with reference to FIGS. 6A, 6B, 7A, and 7B. Blocks 501 and 503 are examples of blocks 401 and 403, respectively, in a process according to FIG. 4A.

Figure 13:
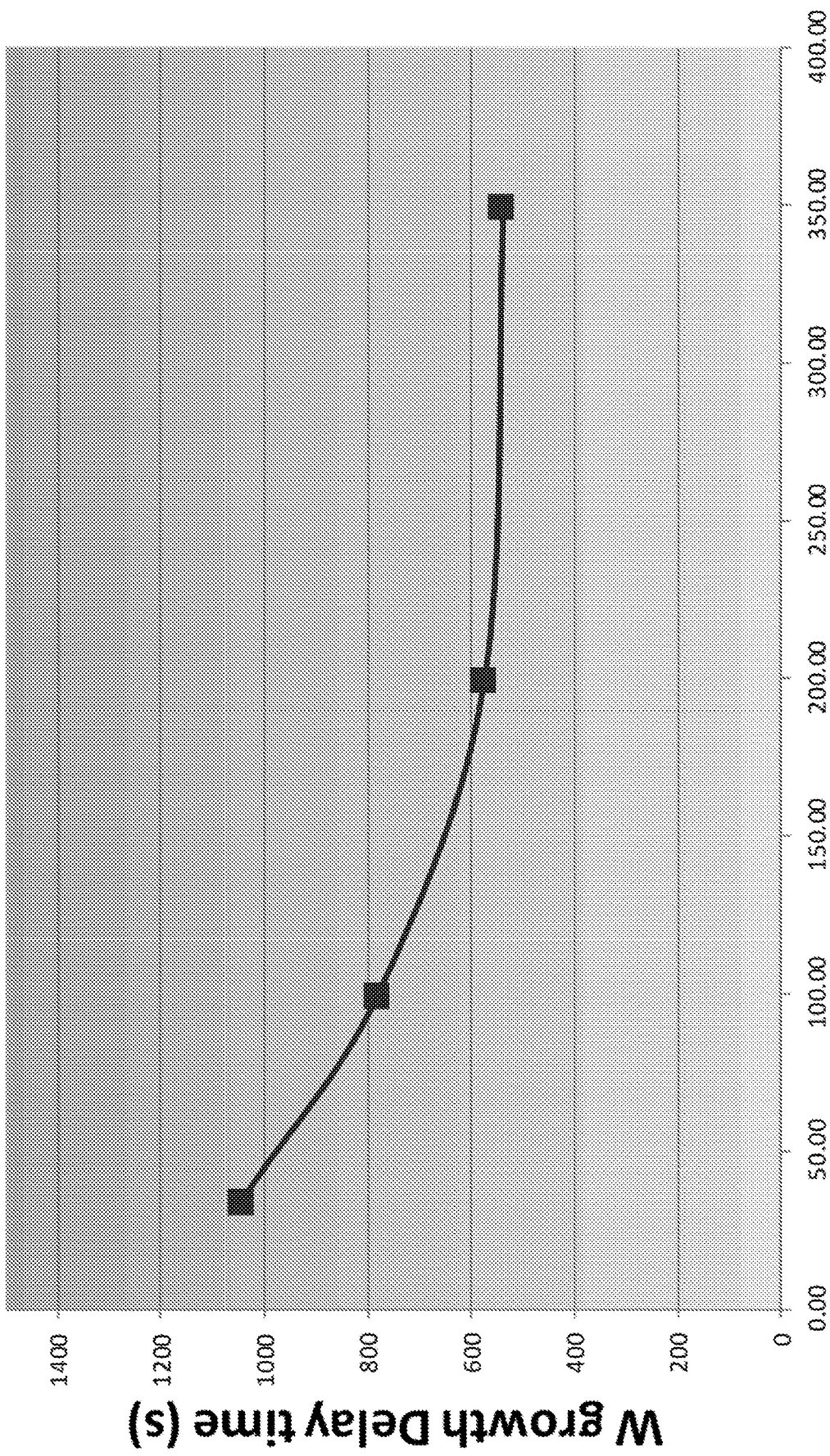
FIG. 13 shows an example of tungsten (W) growth delay time as a function of deposition thickness.

The wafer is exposed to reactant gases to deposit a bulk tungsten layer on the top surface. (505). Deposition of a W bulk layer is described below and may involve an ALD or CVD process. Because nucleation on the edge bevel has been inhibited, there is a significant nucleation delay there, preventing tungsten from growing. FIG. 13 shows a W growth delay time as a function of deposition thickness. As can be seen, growth delay is significant, especially on thin tungsten layers such as nucleation layers. The top surface of the wafer is not inhibited, at least out to a desired radius (e.g., 0.7 mm or 1.7 mm from the bevel) and has uniform deposition thereon.

It should be noted that block 505 may take place after block 503 is completed, or may wholly or partially overlap with block 503. If it overlaps, the edge region is exposed to the inhibition gases while the top of the wafer is exposed to the deposition gases. This may be performed if the inhibition gases are chemically inert to or compatible with the deposition gases.

In FIG. 5B, the wafer is exposed to reactant gases to deposit a W nucleation layer across the wafer in an operation 501 as described above with respect to FIG. 5A. The edge region is then exposed to a gas including a W etchant to remove the deposited film. (502). W etchant chemistries are described below. The flow of the etchant gas is controlled such that the top surface of the wafer is not exposed to the etchant chemistry. Techniques to control the gas are described further below with reference to FIGS. 6A, 6B, 7A, and 7B. Blocks 501 and 502 are examples of blocks 405 and 407, respectively, in a process according to FIG. 4B.

The wafer is then exposed to reactant gases to deposit a bulk tungsten layer on the top surface in an operation 505 as described above with respect to FIG. 5A. Because the nucleation layer on the edge bevel has been removed to expose the underlying surface (e.g., titanium nitride (TiN)), tungsten does not grow there. The top surface of the wafer has uniform deposition thereon, at least out to a desired radius (e.g., 0.7 mm or 1.7 mm from the bevel).

It should be noted that block 505 may take place after block 502 is completed, or may wholly or partially overlap with block 502. If it overlaps, the edge region is exposed to the etchant gases while the top of the wafer is exposed to the deposition gases.

Figure 6A:
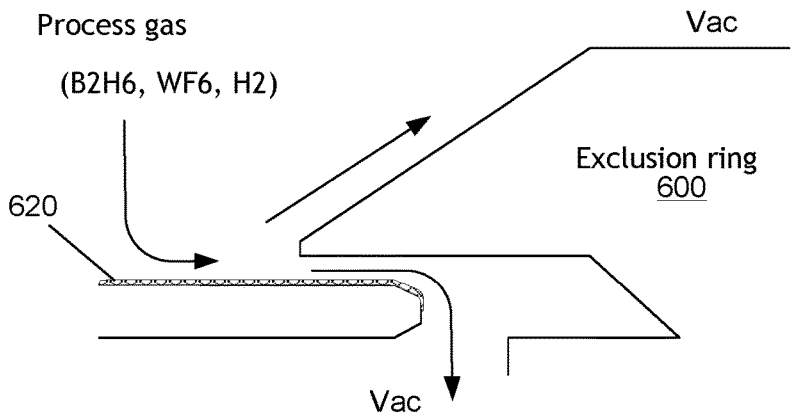
FIGS. 6A and 6B show schematic arrangements of an exclusion ring 600 and wafer during a deposition process according to an examples of methods of depositing tungsten described with respect to FIGS. 5A and 5B.
Figure 6A:
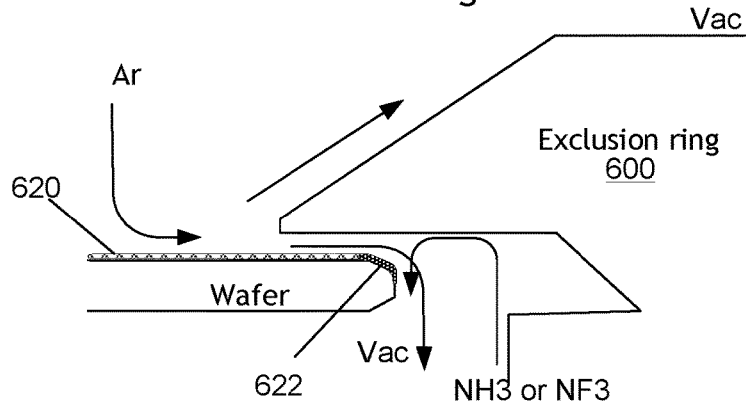
Figure 6A:
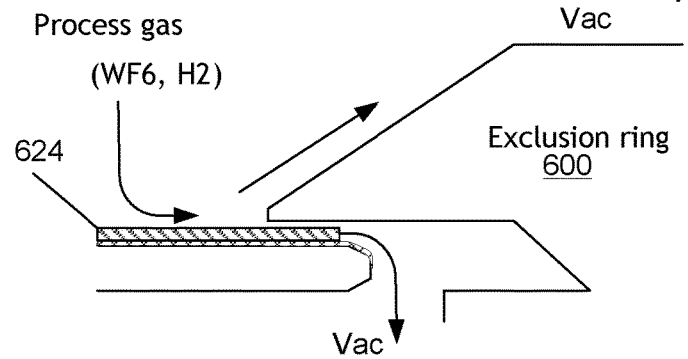

FIG. 6A shows a schematic arrangement of an exclusion ring 600 and wafer during a deposition process according to an example of that described above with respect to FIGS. 5A and 5B. As discussed, a vacuum is used to bring a process gas streamline under the exclusion ring 600 and around the edge, while an inhibition and/or etchant gas source is used to treat the edge.

The amount of process gas pulled to bring the streamline down controls the uniformity of the wafer at close to the edge and the amount of treatment gas and/or how many times it is pulsed in the cavity controls, at least in part, bevel and backside deposition.

First, a W nucleation layer is deposited across the entire wafer, including the edge. Unlike the arrangement shown in FIG. 3, in which at least some of process gas streamlines 312 bend around the exclusion ring 600, in this embodiment, at least some of the process gas is pulled under the ring by a vacuum. The vacuum may be pulled through a pedestal having radial vacuum capability for example. The result is a nucleation layer 620 that extends across the wafer, including at the bevel. Next, a wafer edge treatment is applied. This operation may take place at the same or a different station or chamber than the nucleation layer deposition. Here, an inhibition (e.g., $NH_3$) or etchant (e.g., $NF_3$) gas (also referred to as a treatment gas) is added under the edge ring to treat the edge. The gas can be added through a backside gas manifold, as appropriate. An inert gas (e.g., Ar) flow may be used to prevent diffusion of the inhibition or etchant gas. In some embodiments, the treatment gas may be diluted.

By appropriately controlling the vacuum, the treatment gas flowrate and concentration, the gap distance between the exclusion ring and the wafer, the area of the wafer that is exposed to the treatment gas is controlled. (It should be noted that the treatment gas may be added at any appropriate location proximate to the edge, including at position along the backside or through the ring.)

As a result, an edge area 622 is either inhibited and/or etched without inhibiting or etching the remainder of the top surface of the film. A vacuum is then applied again for full deposition of a bulk layer 624. Although a vacuum pulls the process gases down around the edge of the wafer (thus ensuring uniform deposition on the top surface to at least a threshold radius), the tungsten film does not grow on the inhibited or etched surface as described above.

Figure 6B:
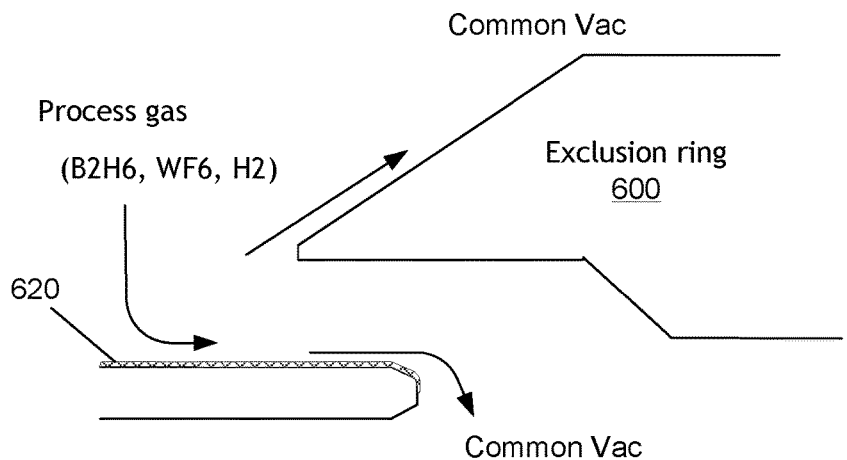
Figure 6B:
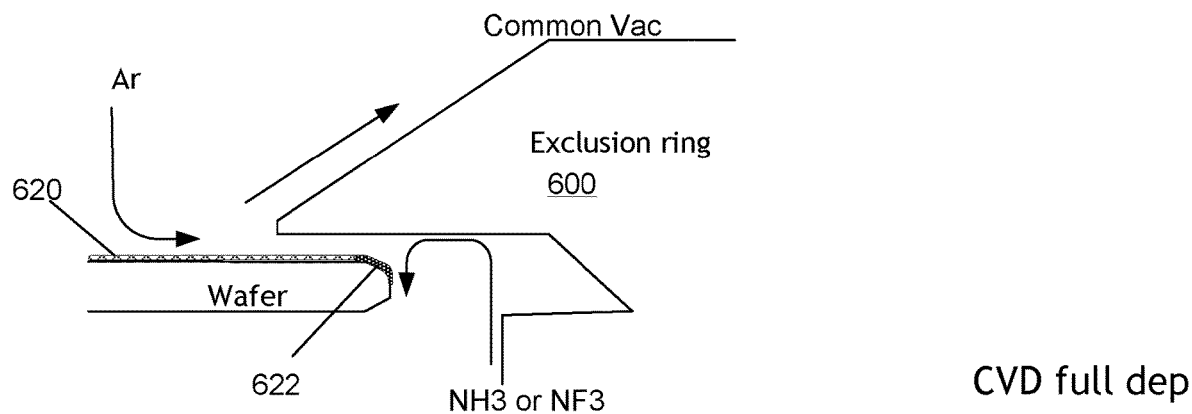
Figure 6B:
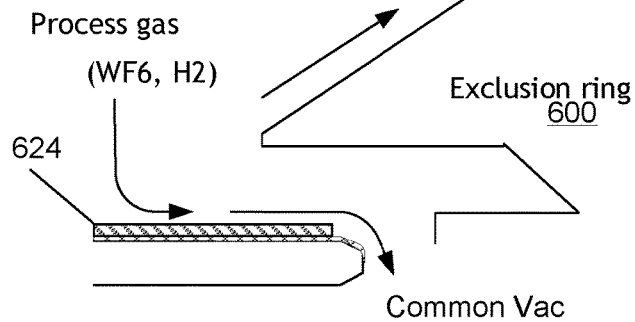

FIG. 6B shows another example of a schematic arrangement of an exclusion ring 600 and wafer during a deposition process according to an example of that described above with respect to FIGS. 5A and 5B. This example is similar to that of FIG. 6A but can be implemented with a common vacuum rather than a vacuum pulled through the pedestal. As in FIG. 6A, a vacuum is used to bring a process gas streamline under the exclusion ring 600 and around the edge of the wafer, while an inhibition and/or etchant gas source is used to treat the edge. The amount of process gas pulled to bring the streamline down controls the uniformity of the wafer at close to the edge and the amount of treatment gas and/or how many times it is pulsed in the cavity controls, at least in part, bevel and backside deposition.

As in FIG. 6A, a W nucleation layer is deposited across the entire wafer, including the edge. Here, the deposition is performed with the exclusion ring 600 lifted off the wafer. This allows a common vacuum to pull process gas over and under the exclusion ring 600. The process gas pulled over the exclusion ring is pulled through the gap between the exclusion ring 600 and a showerhead (not shown). Thus amount of gas flowing under the exclusion ring 600, and thus the deposition on the edge, can be controlled by the size of the gap between the wafer and the exclusion ring 600 relative to the size of the gap between the exclusion ring and the showerhead. In the example of FIG. 6B, the result is a nucleation layer 620 that extends across the wafer, including at the bevel. Next, a wafer edge treatment is applied. This operation may take place at the same or a different station or chamber than the nucleation layer deposition. Here, an inhibition (e.g., $NH_3$) or etchant (e.g., $NF_3$) gas (also referred to as a treatment gas) is added under the exclusion ring 600 to treat the edge. The gas can be added through a backside gas manifold, as appropriate. An inert gas (e.g., Ar) flow may be used to prevent diffusion of the inhibition or etchant gas. In some embodiments, the treatment gas may be diluted. Here, the exclusion ring 600 is lowered relative to the raised position in FIG. 6A. That is, it may be fully lowered, or lowered to an intermediate level. This is to prevent the flow of the treatment gas over the rest of the wafer. According to various embodiments, gas may or may not be pulled under the wafer by the common vacuum. By appropriately controlling the common vacuum, the treatment gas flowrate and concentration, the gap distance between the exclusion ring 600 and the wafer, the area of the wafer that is exposed to the treatment gas is controlled. The treatment gas may be added at any appropriate location proximate to the edge, including at position along the backside or through the ring.

As a result, an edge area 622 is either inhibited and/or etched without inhibiting or etching the remainder of the top surface of the film. The exclusion ring 600 is then lifted for full deposition of a bulk layer 624. Although the common vacuum pulls the process gases down around the edge of the wafer (thus ensuring uniform deposition on the top surface to at least a threshold radius), the tungsten film does not grow on the inhibited or etched surface as described above.

Figure 7A:
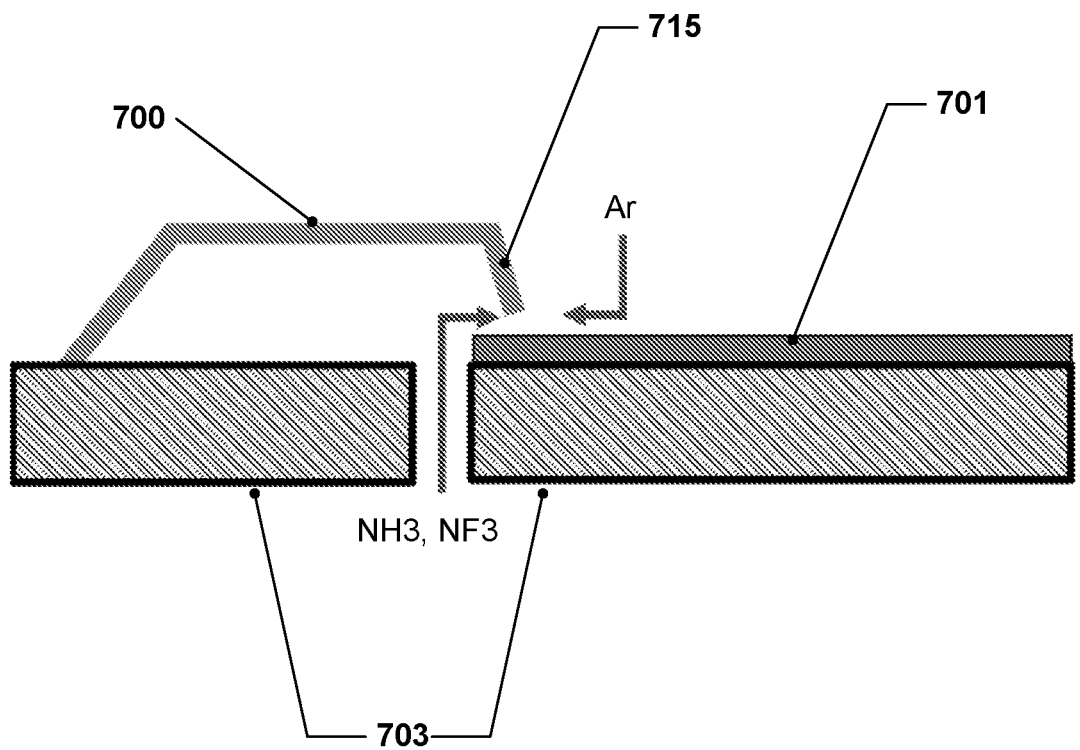
FIGS. 7A and 7B shows schematic illustrations of arrangements of a pedestal including backside gas injection and an exclusion ring that may be used in implementations of the disclosure.
Figure 7B:
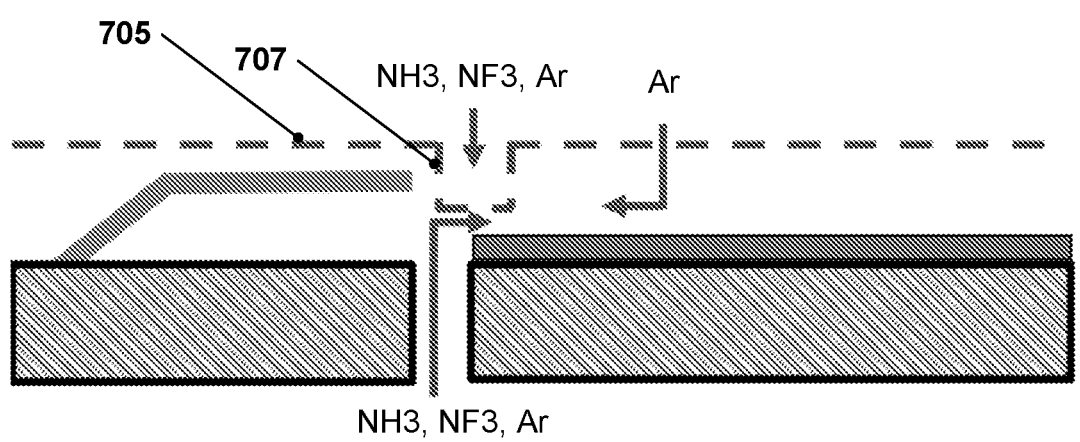

FIGS. 7A and 7B are schematic illustrations of additional arrangements to achieve edge treatment according to various embodiments. In FIG. 7A, the treatment gas (e.g., $NH_3$ or $NF_3$) is added from the backside through the pedestal 703 as in FIG. 6A or 6B. Here, the exclusion ring 700 provides a physical barrier 715 to the backside treatment gas, creating an exclusion zone near the bevel (e.g. between 0 and 1 mm or 0 and 2 mm from the edge) of the wafer 701. Ar or other inert gas may be flowed at other regions to prevent the diffusion of the treatment gas outside the exclusion zone. In FIG. 7B, the treatment gas may be flowed from the topside instead of or in addition to the backside with Ar flow preventing diffusion of the treatment gas. A partition 707 extending the showerhead 705 may provide a physical barrier to diffusion of the treatment gas toward the center of the wafer.

Figure 8:
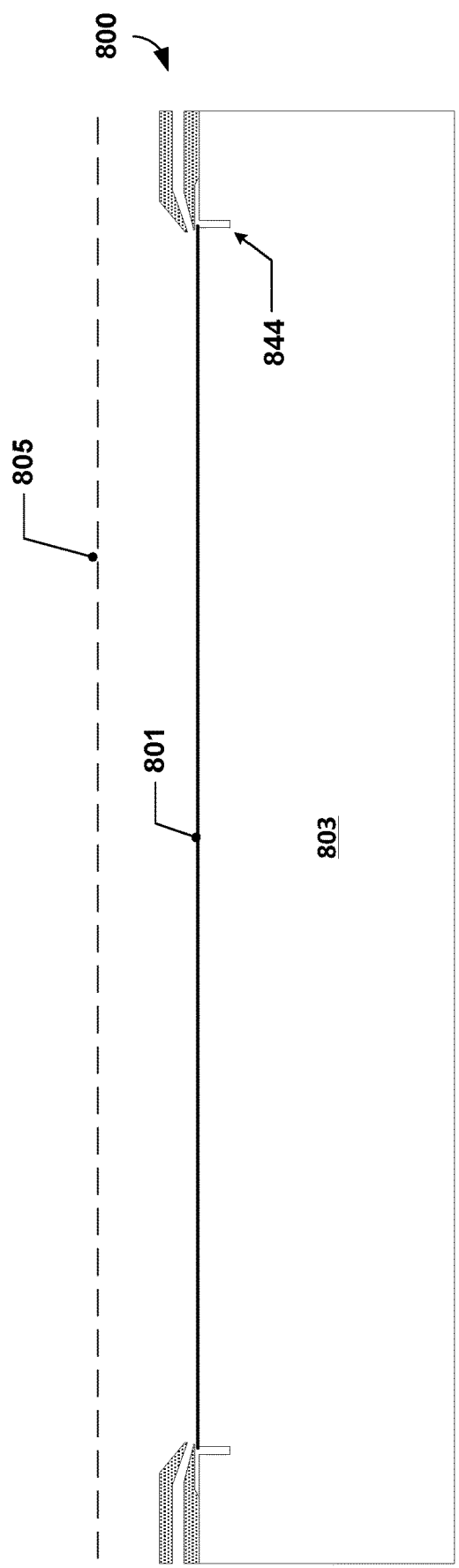
FIG. 8 shows an example exclusion ring assembly having two rings installed on a substrate support according to implementations of the disclosure.

Also provided herein are exclusion rings and associated apparatuses that include multiple planes to direct process gas flows. FIG. 8 shows an exclusion ring assembly 800 having two rings installed on a substrate support 803. The substrate support 803 is shown supporting a substrate, in this example wafer 803. The substrate support 803 includes an annular recess 844 that is in fluid communication with a backside gas source and through which a backside gas may be flowed.

The exclusion ring assembly 800 includes lower and upper rings. The lower ring directs flow of the backside gas to prevent backside deposition or backside and edge deposition and the upper ring directs the process gas close to the substrate at the edge to control deposition there. In this manner, preventing backside and edge deposition is decoupled from uniform deposition up to the threshold distance to which uniform deposition is desired. According to various embodiments, the lower ring and upper ring may be fixed or movable with respect to each other. The amount of gas directed to the edge of the threshold can be controlled by the gap between the showerhead 805 and the upper ring; by moving the upper ring closer to the showerhead 805, more flow goes to the gap between the lower and upper rings, increasing deposition at the edge. Example implementations edge ring assemblies are described further below.

Figure 9A:
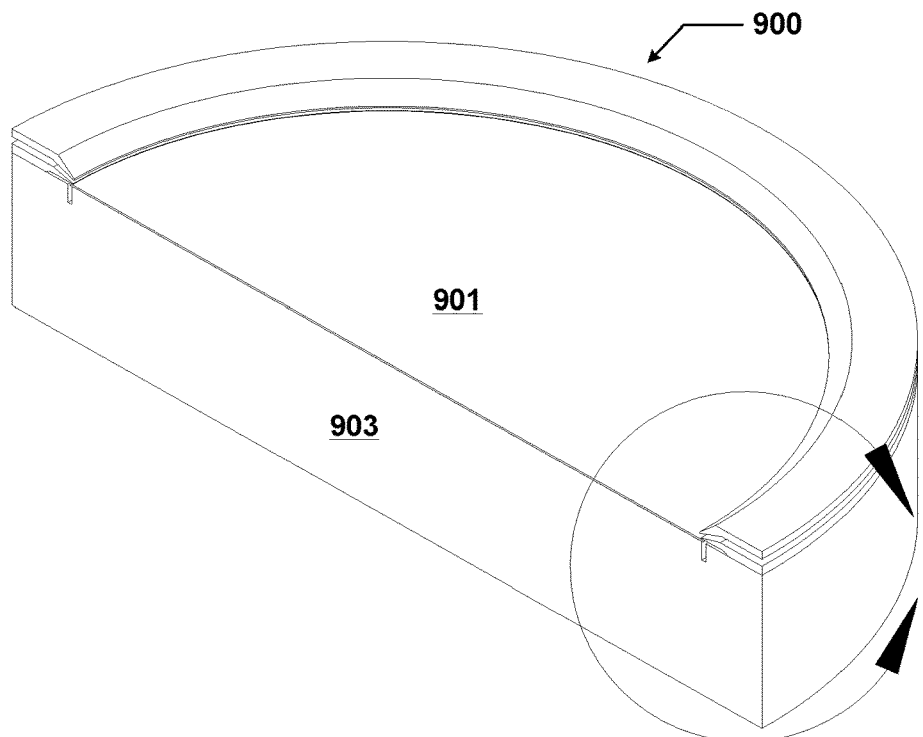
FIG. 9A is an isometric cutaway view of the exclusion ring assembly, pedestal, and wafer shown in FIG. 8, with FIG. 9B a detail view of the indicated region in FIG. 9A.
Figure 9B:
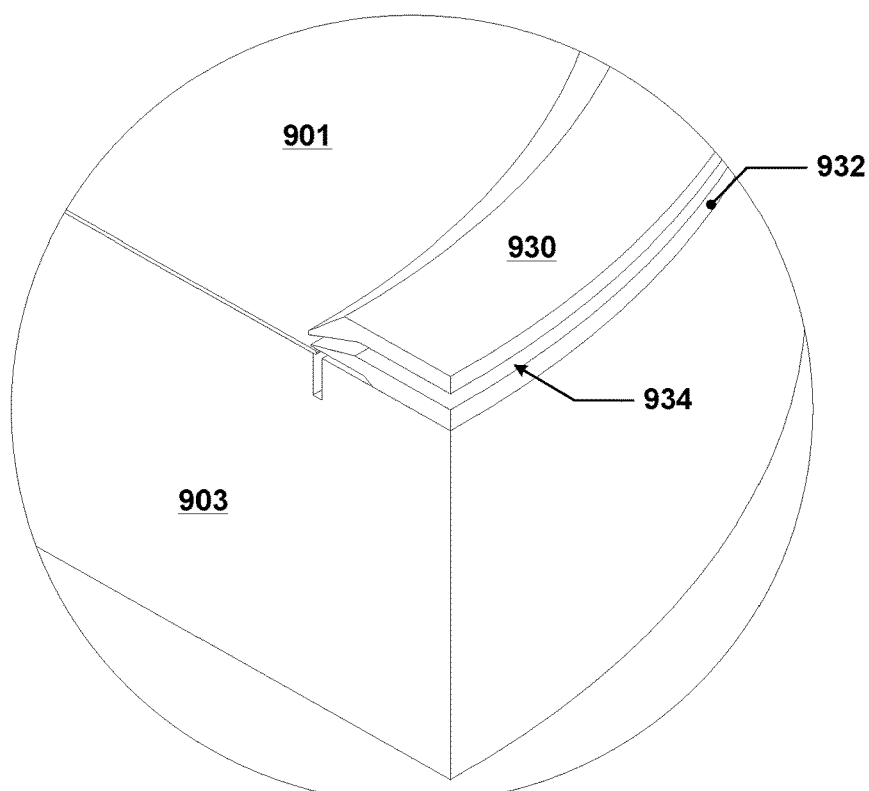
FIGS. 9C and 9D shows schematic illustrations of process gas streamlines for an exclusion ring assembly having two rings at different showerhead-upper ring gaps.

FIG. 9A is an isometric cutaway view of the exclusion ring assembly, pedestal, and wafer shown in FIG. 8, with FIG. 9B a detail view of the indicated region in FIG. 9A. The ring assembly 900 includes an upper ring 930 and a lower ring 932 and is installed on pedestal 903. The upper ring 930 is offset from the lower ring 932 to define a lower annular gas flow passage 934. It should be noted that there may be connections (not shown) between the upper ring 930 and the lower ring 932 in the lower annular gas flow passage 934; these may be small enough to provide no more than negligible interruption of the gas flow. A vacuum may be pulled to draw the process gases through the lower annular gas flow passage 934, as well as between the showerhead (not shown) and the upper ring 930. The amount of gas directed to the edge of the threshold can be controlled by the relative size of the lower annular gas flow passage 934 and the gas flow area between the upper ring 930 and the showerhead. For implementations in which the upper ring 930 is fixed with respect to the lower ring 932, the amount of gas can be controlled by the gap between the showerhead and the upper ring 930; by moving the upper ring 930 closer to the showerhead 805, more flow goes to the gap between the lower and upper rings, increasing deposition (or other processing) at the edge. This is further described with respect to FIGS. 9C and 9D below.

Figure 9C:
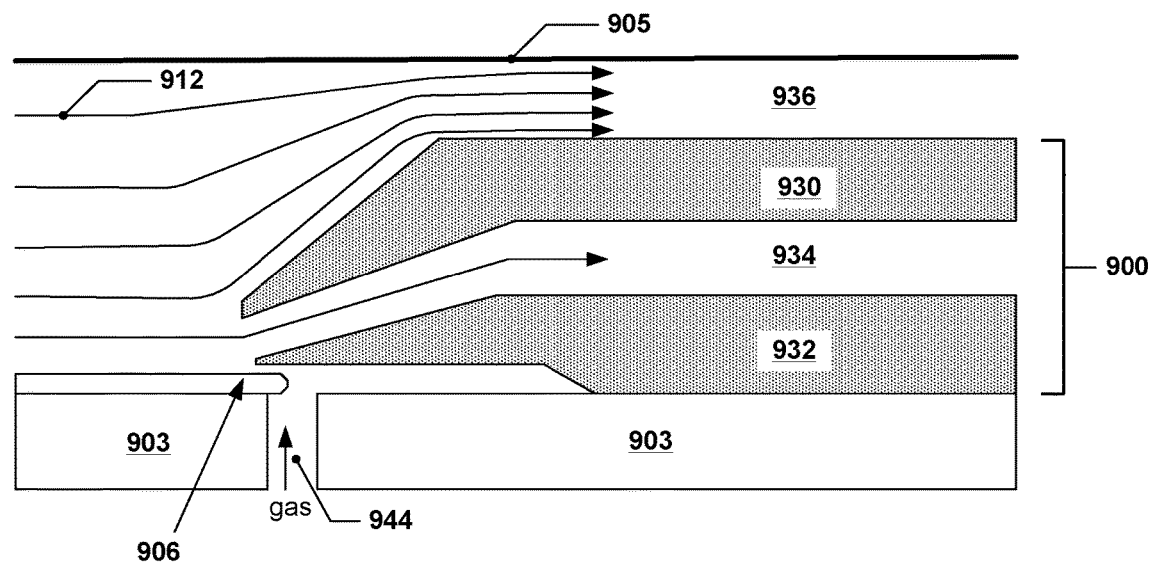
Figure 9D:
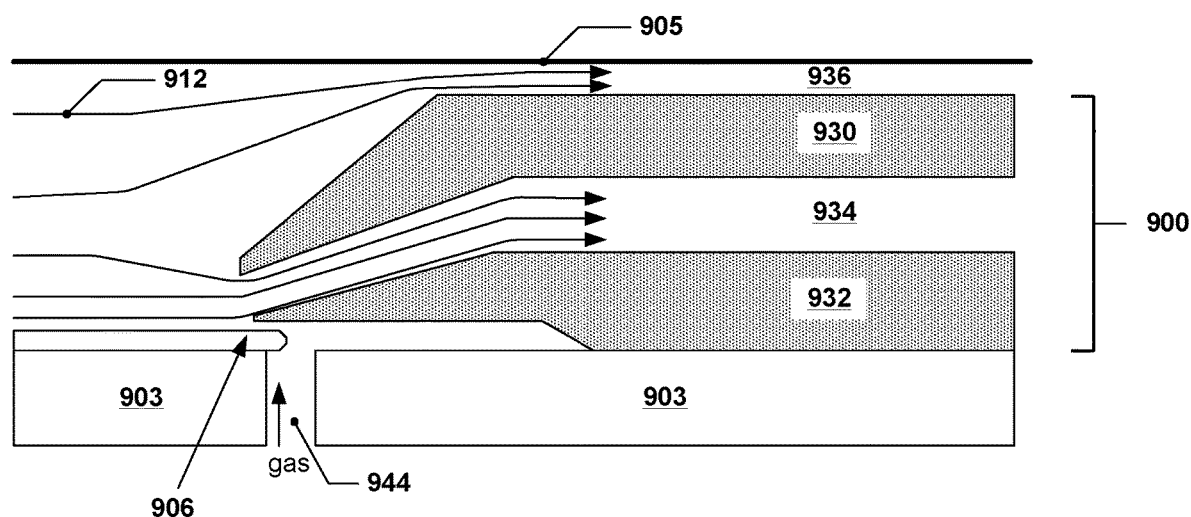

FIGS. 9C and 9C provide schematic illustrations of process gas streamlines 912 for an exclusion ring assembly 900 at different showerhead-upper ring gaps. The ring assembly 900 includes upper ring 930 and lower ring 932, which may be fixed with respect to each other. An annular gap between the upper ring 930 and the showerhead 905 defining an annular gas flow passage 936. In FIG. 9C, the upper ring 930 is further from the showerhead 905 than in FIG. 9D; as such more process gas, as represented by the process gas streamlines 912, is pulled through the annular gas passage 936 in FIG. 9C than in FIG. 9D. More process gas, as represented by the process gas streamlines 912, is pulled through the lower annular gas passage 934 with the showerhead 905 closer to the upper ring 930 as in FIG. 9D than with the showerhead 905 further from the upper ring 930 as in FIG. 9C. In FIG. 9D, the concentration of the process gas is thus greater at a threshold distance from the edge. The threshold distance may be the distance at which uniform processing is desired as represented at point 906 in FIGS. 9C and 9D; point 906 being a point on a circle bounding an exclusion zone between the bevel and the circle. Gas may be injected to provide a flow through an annular recess 944 in the pedestal 903; this can prevent deposition on the bevel and backside as described above. In certain implementations, it may be controlled to prevent deposition within an exclusion zone as described above. In this manner, the relative sizes of the upper annular gas passage 936 and lower annular gas passage 934 provide control over the processing gas concentration (and thus the deposition or other processing) at the exclusion ring boundary that is at least partially decoupled from preventing backside and edge processing. In the example of FIGS. 9C and 9D, the pedestal-showerhead distance may be varied, e.g., by raising or lowering the pedestal.

According to various embodiments, a ring assembly including upper and lower rings as described in FIGS. 8A, 8B, and 9A-9D may be used in any of the methods described above in which the edge region is exposed to an inhibition or etchant gas. In other embodiments, such a ring assembly may be used in methods without selective inhibition or etching of the edge region; that is the ring assembly itself may provide sufficient control over processing gas concentration at the exclusion zone boundary with a backside gas preventing edge deposition to provide uniform deposition and negligible deposition in the exclusion zone. According to various embodiments, the exclusion ring assemblies may be used in a deposition process to provide a non-uniformity of less than 1%, where the non-uniformity is measured as 100% (half of the maximum deviation in thickness (tmax–tmin) divided by the average thickness) to a at least 2 mm or 1 mm from the edge of wafer.

Figure 10A:
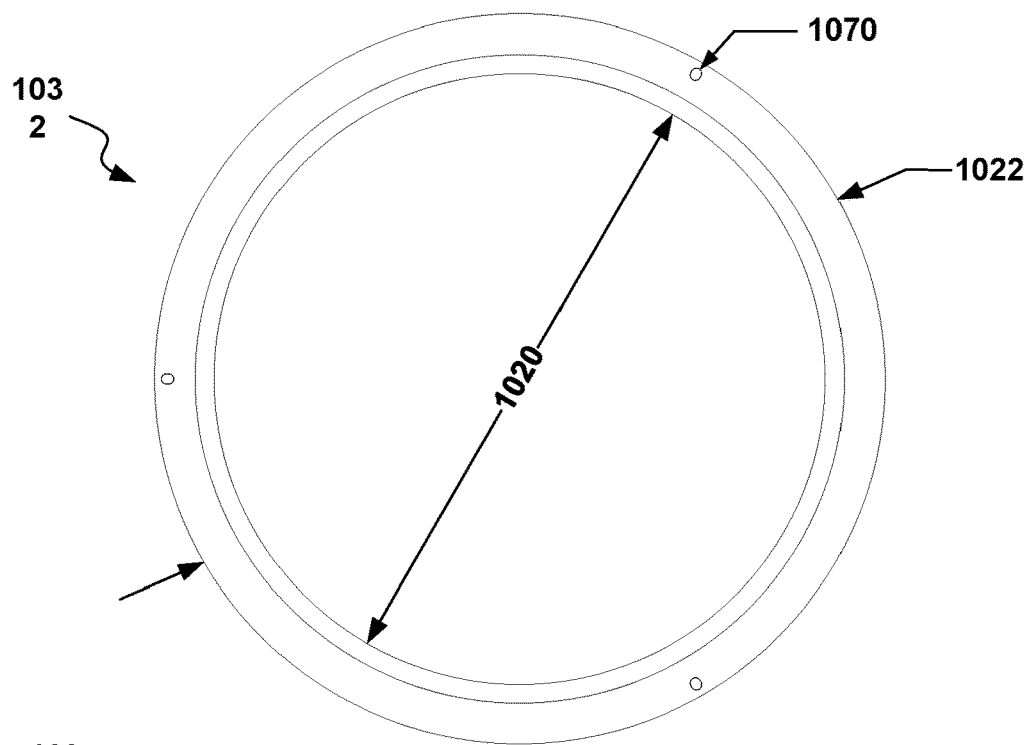
FIGS. 10A, 10B, and 10C show top, side, and bottom views, respectively, of an example of a lower ring of an exclusion ring assembly having two rings according to implementations of the disclosure.
Figure 10B:
Figure 10C:
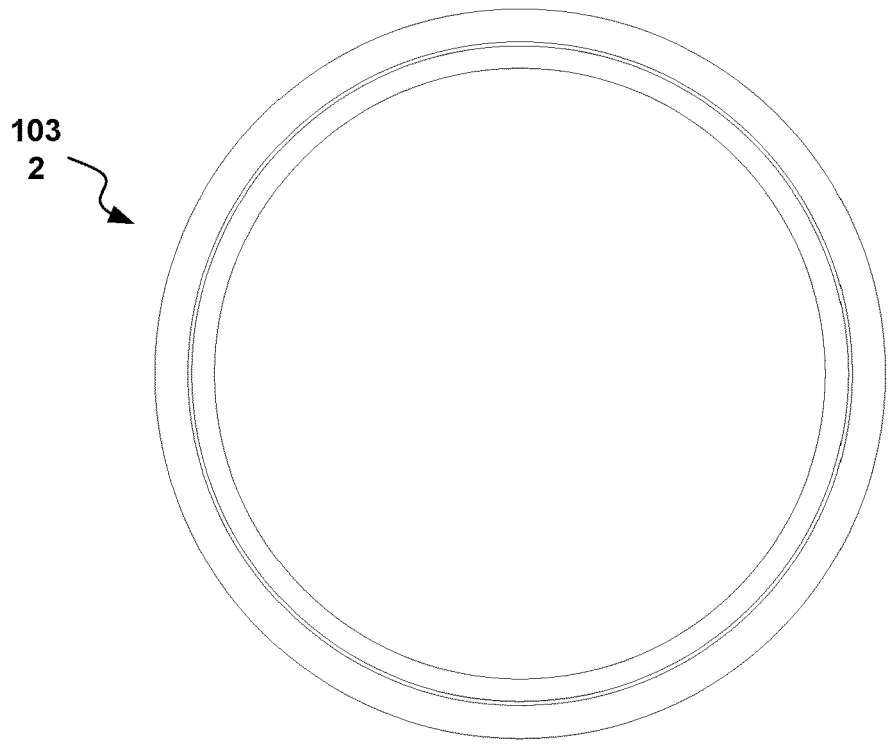

Features of the upper and lower rings of the ring assembly are described with respect to FIGS. 10 and 11. First, FIGS. 10A, 10B, and 10C show top, side, and bottom views, respectively, of an example of a lower ring 1032, which has an inner diameter 1020a and an outer diameter 1022a. Three recesses 1070 are shown in the top surface in FIG. 10A; these accommodate posts on the upper ring. Other features may be present on the lower ring, such tabs or other features as described with respect to the exclusion ring 100 discussed above.

Figure 11A:
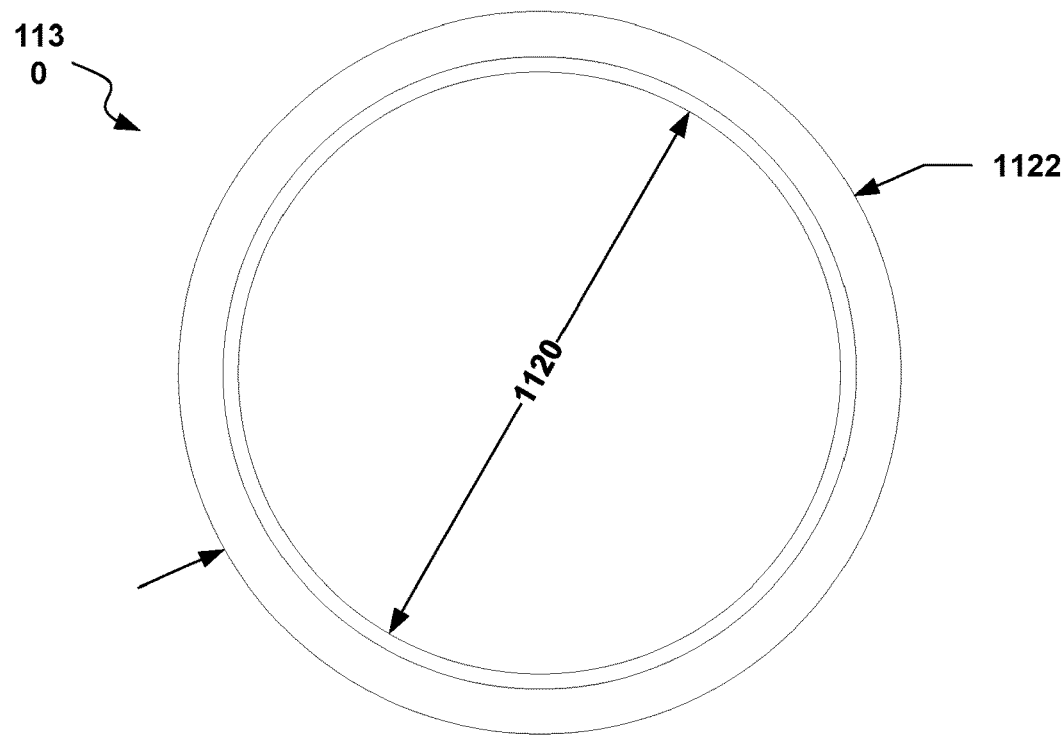
FIGS. 11A, 11B, and 11C show top, side, and bottom views, respectively, of an example of an upper ring of an exclusion ring assembly having two rings according to implementations of the disclosure.
Figure 11B:
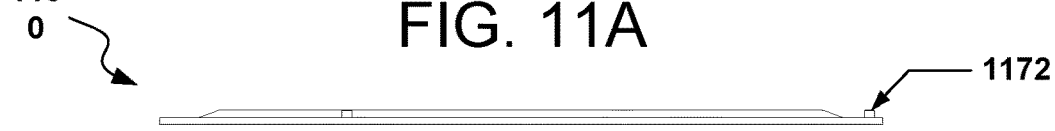
Figure 11C:
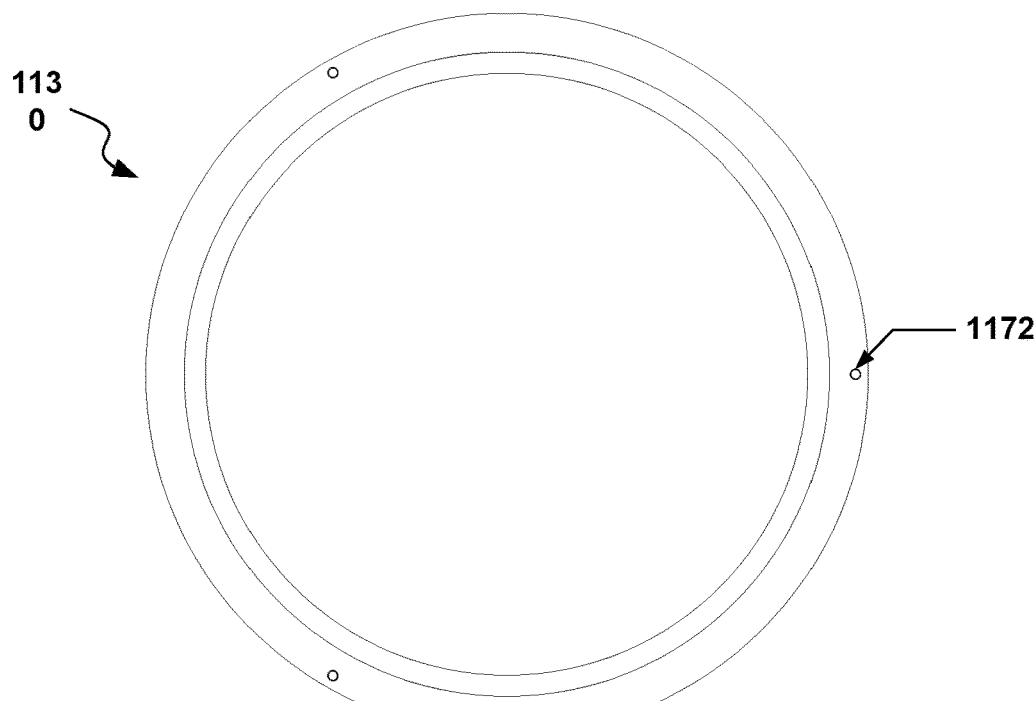

FIGS. 11A, 11B, and 11C show top, side, and bottom views, respectively, of an example of an upper ring 1030. Three posts 1172 protruding from the bottom surface are shown; the posts 1172 fit within the recesses 1070 in the lower ring 1032. Other features may be present on the upper ring such as those discussed above with respect to the exclusion ring 100. It will be understood that recesses may be in the upper ring with posts in the lower ring or that the rings may be connected physically by any appropriate connection.

In some embodiments, the inner diameter 1122 of the upper ring is smaller than the inner diameter 1022 of the lower ring such that the upper ring extends inwardly over the lower ring. In some other embodiments, the inner diameter 1022 of the lower ring may be smaller than the inner diameter 1122 of the upper ring. If the upper ring inner diameter ($ID_{upper}$) is too large in relation to the lower ring inner diameter ($ID_{lower}$), the upper ring may not effectively direct the process gas. If it is too small, it concentrate gases further away from the edge than desired. For a ring assembly for a 300 mm wafer, in some embodiments, the upper ring may extend 0.04 inches less than ring to 0.12 past the lower ring:

$$ID_{lower}-0.12 \text{ inches} \leq ID_{upper} \leq ID_{lower}+0.04 \text{ inches}$$

It is understood that these parameters may vary depending factors including on wafer size, the offset between the rings, etc.

Figure 12:
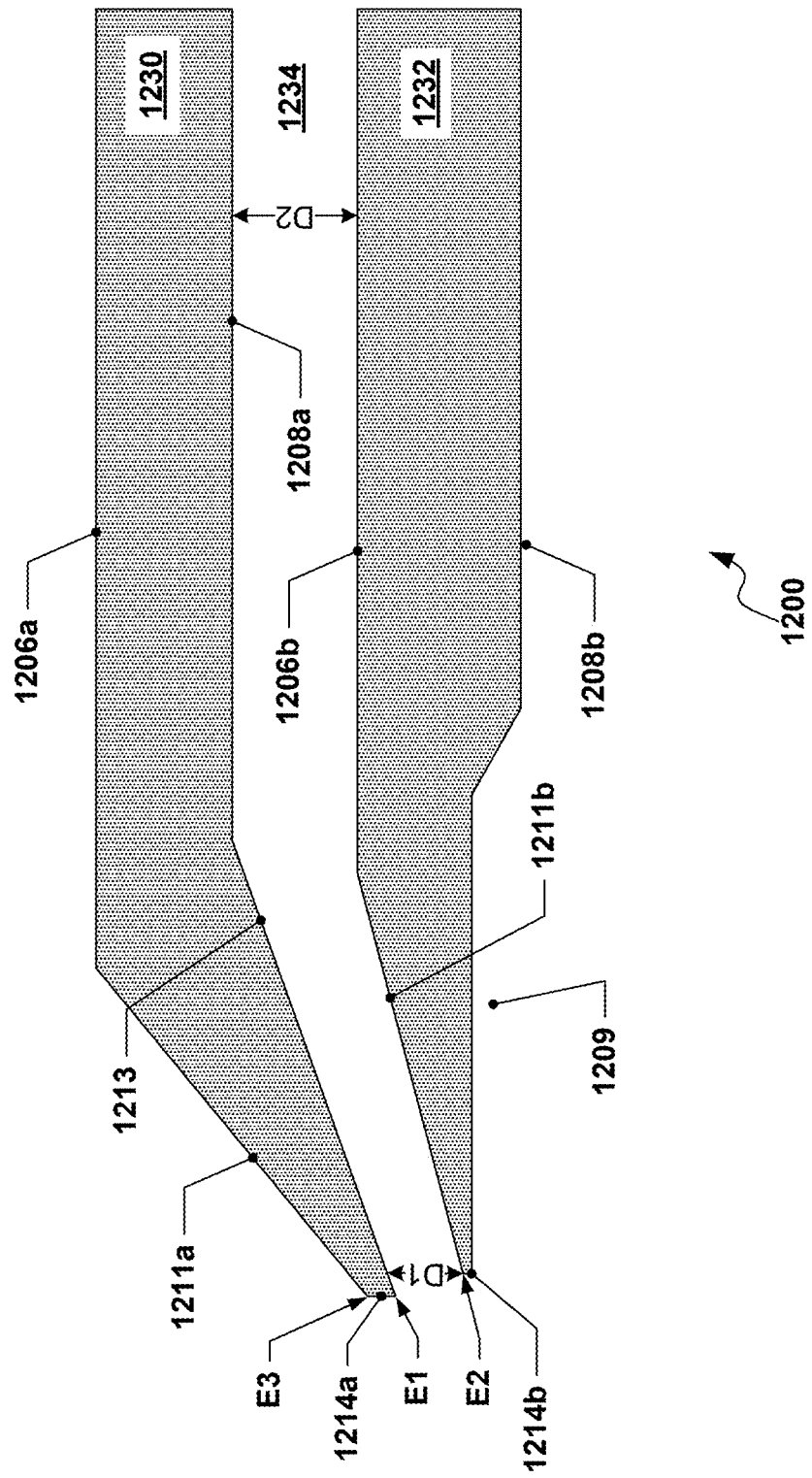
FIG. 12 shows a detail view of a section of an example of a ring assembly having two rings at the inner perimeters of the upper and lower rings according to implementations of the disclosure.

FIG. 12 shows a detail view of a section of a ring assembly 1200 at the inner perimeters of the upper and lower rings. As described above with respect to exclusion ring 100 in FIGS. 1A-1E, each of the upper ring 1230 and lower ring 1232 has substantially parallel top and bottom (or first and second) surfaces. In FIG. 12, upper ring 1230 has a top surface 1206a and a bottom surface 1208a that are substantially parallel each other as well as to a reference plane that is perpendicular to the center axis of the annular ring. Lower ring 1232 has a top surface 1206b and a bottom surface 1208b that are substantially parallel each other as well as to a reference plane that is perpendicular to the center axis of the annular ring. In the example of FIG. 12, lower ring 1232 also includes a recess 1209 allowing the ring assembly 1200 to be placed over a wafer.

In the example of FIG. 12, the upper ring 1230 also has a sloped bottom surface 1213, which may be a sloped portion of bottom surface 1208a or a separate surface separated by an edge. An annular gas flow passage 1234 may be defined by the sloped bottom surface 1213, the bottom surface 1208a, the sloped top surface 1211b, and the top surface 1206b. The slopes of the sloped top surface 1211b and the sloped bottom surface 1213 may be such that the offset (D1) of the upper and lower rings at the inner opening of the annular gas passage 1234 is less than that the offset (D2) at the outlet of the annular gas passage. Here, this inner opening, where the D1 label is located, of the ring assembly 1200 may be considered an innermost axisymmetric opening extending circumferentially around a center axis of the ring assembly 1200. In the example of FIG. 12, the offset D2 is the same as at the outlet with top surface 1206b being parallel to bottom surface 1208a. This is to provide fine control at the inside tip of the upper ring by making it close to the wafer surface, while reducing flow restriction in the annular gas passage itself. In one example, the distance D1 may be 0.062 inches and the distance D2 may be 0.125 inches.

In the example of FIG. 12, the upper ring 1230 includes an inner surface 1214a and the lower ring an inner surface 1214b. In some implementations, these may be omitted. Example dimensions of each may range from 0 (if not present) to 0.08 inches. As further illustrated, the inner surface 1214a of the upper ring 1230 may be considered a first innermost axisymmetric surface 1214a, and the sloped bottom surface 1213 may be considered a bottom frustoconical surface 1213. The first innermost axisymmetric surface 1214a and the bottom frustoconical surface 1213 intersect to form a first edge E1. Also, the inner surface 1214b of the lower ring 1232 may be considered a second innermost axisymmetric surface 1214b, and the sloped top surface 1211b may be considered a top frustoconical surface 1211b that faces the bottom frustoconical surface 1213. The second innermost axisymmetric surface 1214b and the top frustoconical surface 1211b intersect to form a second edge E2. The first edge E1 and the second edge E2 define the innermost axisymmetric opening of the exclusion ring assembly 1200. As can be seen in this example, the second edge E2 is radially outwards of the first edge E1 with respect to the center axis of the exclusion ring assembly 1200. The annular gas flow passage 1234 is seen terminating at the innermost opening such that the innermost axisymmetric opening forms the opening of the annular gas flow passage 1234. In some cases, like shown in FIG. 12, the innermost axisymmetric opening is oriented at an acute angle or an obtuse angle with respect to the center axis of the exclusion ring assembly 1200.

Further in FIG. 12, the upper annular ring 1230 further includes the sloped top surface 1211a which may be considered an upper frustoconical surface 1211a. This sloped top surface 1211a and the upper frustoconical surface 1211a intersect to form a third edge E3. The top surface 1206a of the upper annular ring 1230 may also be considered an annular top surface 1206a that intersects with the upper frustoconical surface 1211a, and the annular top surface 1206a may be substantially parallel to a reference plane perpendicular to the center axis of the exclusion ring assembly 1200. Similarly, the lower annular ring 1232 has a top surface 1206b that intersects with the top frustoconical surface 1211b and that is substantially parallel to the reference plane perpendicular to the center axis of the exclusion ring assembly 1200.

An exclusion ring assembly as described above may be a ceramic material, including aluminum oxide or aluminum nitride. Methods of manufacturing the exclusion ring assembly are also provided and may include forming a green body from a ceramic powder, firing the green body, and then grinding it to form any of the exclusion ring assemblies described above. The upper and lower rings may be manufactured as separate components or as a single component. The exclusion ring assembly may be attached to a pedestal or disposed on a pedestal without attachment. Guides on the pedestal may be used in some embodiments to hold the exclusion ring in place. In some embodiments, a pedestal may be cast or welded, brazed, and machined. The pedestal may be formed with appropriate guides.

While the above description chiefly describes the use of exclusion rings in the context of tungsten deposition, the exclusion rings may be implemented for uniform processing using any relevant semiconductor processing operation up to a threshold distance from the wafer edge without processing at the edge or appropriately treating the etch. Relevant process operations include those in which a process gas is distributed radially from a showerhead in a chamber. Processes that are in continuum flow regime for which uniformity to very close to the edge of the substrate without deposition on edge or backside of the substrate is desired may benefit. These include any CVD or ALD operation including deposition of conductive or dielectric materials including but not limited to tungsten nitride (WN) and tungsten carbide (WC), titanium-containing materials (e.g., titanium (Ti), titanium nitride (TiN), titanium silicide (TiSi), titanium carbide (TiC) and titanium aluminide (TiAl)), tantalum-containing materials, nickel-containing materials, ruthenium-containing material, cobalt-containing materials, molybdenum-containing materials, and the like.

In some implementations, the methods described herein involve deposition of a nucleation layer prior to deposition of a bulk layer. As described above, the nucleation layer is deposited across the wafer, including on the wafer bevel. A nucleation layer is typically a thin conformal layer that facilitates subsequent deposition of bulk material thereon. For example, a nucleation layer may be deposited prior to any fill of the feature and/or at subsequent points during fill of the feature (e.g., via interconnect) on a wafer surface. For example, in some implementations, a nucleation layer may be deposited following etch of tungsten in a feature, as well as prior to initial tungsten deposition.

In certain implementations, the nucleation layer is deposited using a pulsed nucleation layer (PNL) technique. In a PNL technique to deposit a tungsten nucleation layer, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. Pat. Nos. 6,635,965; 7,005,372; 7,141,494; 7,589,017, 7,772,114, 7,955,972 and 8,058,170, and U.S. Patent Publication No. 2010-0267235, all of which are incorporated by reference herein in their entireties. Nucleation layer thickness can depend on the nucleation layer deposition method as well as the desired quality of bulk deposition. In general, nucleation layer thickness is sufficient to support high quality, uniform bulk deposition. Examples may range from 10 Å-100 Å.

While examples of PNL deposition are provided above, the methods described herein are not limited to a particular method of tungsten nucleation layer deposition, but include deposition of bulk tungsten film on tungsten nucleation layers formed by any method including PNL, ALD, CVD, and physical vapor deposition (PVD). Moreover, in certain implementations, bulk tungsten may be deposited directly in a feature without use of a nucleation layer. For example, in some implementations, the feature surface and/or an already-deposited under-layer supports bulk tungsten deposition. In some implementations, a bulk tungsten deposition process that does not use a nucleation layer may be performed. U.S. patent application Ser. No. 13/560,688, filed Jul. 27, 2012, incorporated by reference herein, describes deposition of a tungsten bulk layer without a nucleation layer, for example.

In various implementations, tungsten nucleation layer deposition can involve exposure to a tungsten-containing precursor such as tungsten hexafluoride ($WF_6$), tungsten hexachloride ($WCl_6$), and tungsten hexacarbonyl ($W(CO)_6$). In certain implementations, the tungsten-containing precursor is a halogen-containing compound, such as $WF_6$. Organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten) may also be used.

Examples of reducing agents can include boron-containing reducing agents including diborane ($B_2H_6$) and other boranes, silicon-containing reducing agents including silane ($SiH_4$) and other silanes, hydrazines, and germanes. In some implementations, pulses of tungsten-containing precursors can be alternated with pulses of one or more reducing agents, e.g., S/W/S/W/B/W, etc., W represents a tungsten-containing precursor, S represents a silicon-containing precursor, and B represents a boron-containing precursor. In some implementations, a separate reducing agent may not be used, e.g., a tungsten-containing precursor may undergo thermal or plasma-assisted decomposition.

According to various implementations, hydrogen may or may not be run in the background. Further, in some implementations, deposition of a tungsten nucleation layer may be followed by one or more treatment operations prior to tungsten bulk deposition. Treating a deposited tungsten nucleation layer to lower resistivity is described for example in U.S. Pat. Nos. 7,772,114 and 8,058,170 and U.S. Patent Publication No. 2010-0267235, incorporated by reference herein.

Still further, the methods described herein are not limited to tungsten deposition but may be implemented to deposit other materials for which a nucleation layer may be deposited as described below.

Bulk Deposition

As described above, bulk deposition of tungsten may be performed across a wafer. In many implementations, tungsten bulk deposition can occur by a CVD process in which a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Various tungsten-containing gases including, but not limited to, $WF_6$, $WCl_6$, and $W(CO)_6$ can be used as the tungsten-containing precursor. In certain implementations, the tungsten-containing precursor is a halogen-containing compound, such as $WF_6$. In certain implementations, the reducing agent is hydrogen gas, though other reducing agents may be used including silane ($SiH_4$), disilane ($Si_2H_6$) hydrazine ($N_2H_4$), diborane ($B_2H_6$) and germane ($GeH_4$). In many implementations, hydrogen gas is used as the reducing agent in the CVD process. In some other implementations, a tungsten precursor that can decompose to form a bulk tungsten layer can be used. Bulk deposition may also occur using other types of processes including ALD processes.

Examples of temperatures may range from 200° C. to 500° C. According to various implementations, any of the CVD W operations described herein can employ a low temperature CVD W fill, e.g., at about 250° C.-350° C. or about 300° C.

Deposition may proceed according to various implementations until a certain feature profile is achieved, a certain wafer edge profile is achieved, and/or a certain amount of tungsten is deposited. In some implementations, the deposition time and other relevant parameters may be determined by modeling and/or trial and error. In some implementations, a process chamber may be equipped with various sensors to perform in-situ metrology measurements for end-point detection of a deposition operation. Examples of in-situ metrology include optical microscopy and X-Ray Fluorescence (XRF) for determining thickness of deposited films.

It should be understood that the tungsten films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic) tungsten. In some implementations, the films may be a mixture of metallic or elemental tungsten (W) and other tungsten-containing compounds such as tungsten carbide (WC), tungsten nitride (WN), etc.

CVD and ALD deposition of these materials can include using any appropriate precursors. For example, CVD and ALD deposition of tungsten nitride can include using halogen-containing and halogen-free tungsten-containing and nitrogen-containing compounds as described further below. CVD and ALD deposition of titanium-containing layers can include using precursors containing titanium with examples including tetrakis(dimethylamino)titanium (TDMAT) and titanium chloride ($TiCl_4$), and if appropriate, one or more co-reactants. CVD and ALD deposition of tantalum-containing layers can include using precursors such as pentakis-dimethylamino tantalum (PDMAT) and $TaF_5$ and, if appropriate, one or more co-reactants. CVD and ALD deposition of cobalt-containing layers can include using precursors such as tris(2,2,6,6-tetramethyl-3,5-heptanedionato)cobalt, bis(cyclopentadienyl)cobalt, and dicobalt hexacarbonyl butylacetylene, and one or more co-reactants. CVD and ALD deposition of nickel-containing layers can include using precursors such as cyclopentadienylallylnickel ($CpAllylNi$) and $MeCp_2Ni$. CVD and ALD deposition of molybdenum can include using precursors such as molybdenum hexafluoride (MoF6), molybdenum pentachloride (MoCl5), molybdenum dichloride dioxide (MoO2Cl2), molybdenum tetrachloride oxide (MoOCl4), and molybdenum hexacarbonyl (Mo(CO)6). Examples of co-reactants can include $N_2$, $NH_3$, $N_2H_4$, $N_2H_6$, $SiH_4$, $Si_3H_6$, $B_2H_6$, $H_2$, and $AlCl_3$.

Tungsten Etch

Etching tungsten can be performed by exposing the tungsten to one or more etchant species that can react with tungsten. Examples of etchant species include halogen species and halogen-containing species. Example of initial etchant materials that can be used for removal of tungsten-containing materials include nitrogen tri-fluoride ($NF_3$), tetra-fluoro-methane ($CF_4$), tetrafluoroethylene ($C_2F_4$), hexafluoroethane ($C_2F_6$), and octafluoropropane ($C_3F_8$), tri-fluoro-methane ($CHF_3$), chlorotrifluoromethane ($CF_3Cl$), sulfur hexafluoride ($SF_6$), and molecular fluorine ($F_2$). In some implementations, the species can be activated and include radicals and/or ions. For example, an initial etchant material may be flown through a remote plasma generator and/or subjected to an in-situ plasma. However, for the implementations described above with reference to FIGS. 5B, 6, 7A, and 7B, the tungsten is generally exposed to non-plasma etchant vapor.

In addition to the examples given above, any known etchant chemistry may be used for etching non-tungsten-containing films as well as tungsten-containing films. For example, fluorine-containing compounds such as $NF_3$, may be used for titanium-containing compounds such as TiN and TiC. Chlorine-containing compounds such as $Cl_2$ and $BCl_3$ may be used in some implementations, for example to etch TiAl, TiAlN, nickel-containing compounds and cobalt-containing compounds.

According to various implementations, some or all etch operations can be performed in the same chamber in which other operations including deposition and/or treatment operations are performed, or in a dedicated etch chamber. In various implementations, etching is performed until a certain characteristic of the deposited tungsten is removed or a certain profile is achieved. For example, the etch may be performed until the tungsten nucleation layer at the bevel is removed. In some implementations, the etch endpoint for particular etch process parameters may be determined by modeling and/or trial and error for a particular edge geometry and the profile and amount of deposited tungsten being etched. In some implementations, a process chamber may be equipped with various sensors to perform in-situ metrology measurements to identify the extent of removal. Examples of in-situ metrology include optical microscopy and XRF for determining thickness of films. Further, infrared (IR) spectroscopy may be used to detect amounts of tungsten fluoride (WFx) or other byproducts generated during etching. In some implementations, an under-layer may be used as an etch-stop layer. Optical emission spectroscopy (OES) may also be used to monitor the etch. According to various implementations, an etch of tungsten may be more or less preferential (or non-preferential) to an under-layer. For example, an etch can be preferential to W with, for example, a Ti or TiN underlayer acting as an etch stop. In some implementations, the etch can etch W and Ti or TiN with an underlying dielectric acting as an etch stop.

Inhibition of Tungsten Nucleation

As described in U.S. Patent Publication No. 20170365513, inhibition can involve exposure to activated species that passivate the feature surfaces, thermal inhibition processes are provided. Thermal inhibition processes generally involve exposing the feature to a nitrogen-containing compound such as ammonia ($NH_3$) or hydrazine ($N_2H_4$) to non-conformally inhibit the feature near the feature opening. In some embodiments, the thermal inhibition processes are performed at temperatures ranging from 250° C. to 450° C. At these temperatures, exposure of a previously formed tungsten nucleation layer to $NH_3$ results in an inhibition effect. Other potentially inhibiting chemistries such as nitrogen ($N_2$) or hydrogen ($H_2$) may be used for thermal inhibition at higher temperatures (e.g., 900° C.). For many applications, however, these high temperatures exceed the thermal budget. In addition to ammonia, other hydrogen-containing nitriding agents such as hydrazine may be used at lower temperatures appropriate for back end of line (BEOL) applications.

Nitridation of a surface can passivate it. Subsequent deposition of tungsten on a nitrided surface is significantly delayed, compared to on a regular bulk tungsten film. In addition to $NF_3$, fluorocarbons such as $CF_4$ or $C_2F_8$ may be used. However, in certain implementations, the inhibition species are fluorine-free to prevent etching during selective inhibition.

In addition to tungsten surfaces, nucleation may be inhibited on liner/barrier layers surfaces such as TiN and/or WN surfaces. Any chemistry that passivates these surfaces may be used. Inhibition chemistry can also be used to tune an inhibition profile, with different ratios of active inhibiting species used. For example, for inhibition of W surfaces, nitrogen may have a stronger inhibiting effect than hydrogen; adjusting the ratio of $N_2$ and $H_2$ gas in a forming gas can be used to tune a profile.

In certain implementations, the substrate can be heated up or cooled down before inhibition. A predetermined temperature for the substrate can be selected to induce a chemical reaction between the feature surface and inhibition species and/or promote adsorption of the inhibition species, as well as to control the rate of the reaction or adsorption. For example, a temperature may be selected to have high reaction rate such that more inhibition occurs near the gas source.

In some embodiments, inhibition can involve a chemical reaction between the thermal inhibitor species and the feature surface to form a thin layer of WN compound material. In some embodiments, inhibition can involve a surface effect such as adsorption that passivates the surface without forming a layer of a compound material.

If a tungsten nucleation layer is present, it may be exposed to $NH_3$ or other inhibition vapor to selectively inhibit the wafer at its edge. In some embodiments, if a bulk tungsten or tungsten-containing layer is present, a reducing agent/tungsten-containing precursor/nitrogen-containing inhibition chemistry may be employed to form WN on the bulk layer. These reactants may be introduced in sequence (e.g., $B_2H_6$/$WF_6$/$NH_3$ pulses) or simultaneously. Any appropriate reducing agent (e.g., diborane or silane) and any appropriate tungsten-containing precursor (e.g., tungsten hexafluoride or tungsten hexacarbonyl) may be used.

While the description above focuses on tungsten deposition, aspects of the disclosure may also be implemented in depositing other materials. For example, edge exclusion control using other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium alumide (TiAl)), tantalum-containing materials (e.g., tantalum (Ta), tantalum nitride (TaN)), and nickel-containing materials (e.g., nickel (Ni) and nickel silicide (NiSi), may be performed. Inhibition of cobalt materials, for example, may be performed as using a nitrogen-containing gas.

Apparatus

The methods presented herein may be carried out in various types of deposition apparatuses available from various vendors. Examples of a suitable apparatus include a Novellus Concept-1 ALTUS™, a Concept 2 ALTUS™, a Concept-2 ALTUS-S™, Concept 3 ALTUS™ deposition system, and ALTUS Max™ or any of a variety of other commercially available chemical vapor deposition (CVD) tools. Stations in both single station and multi-station deposition apparatuses can be used to perform the methods described above.

Figure 14:
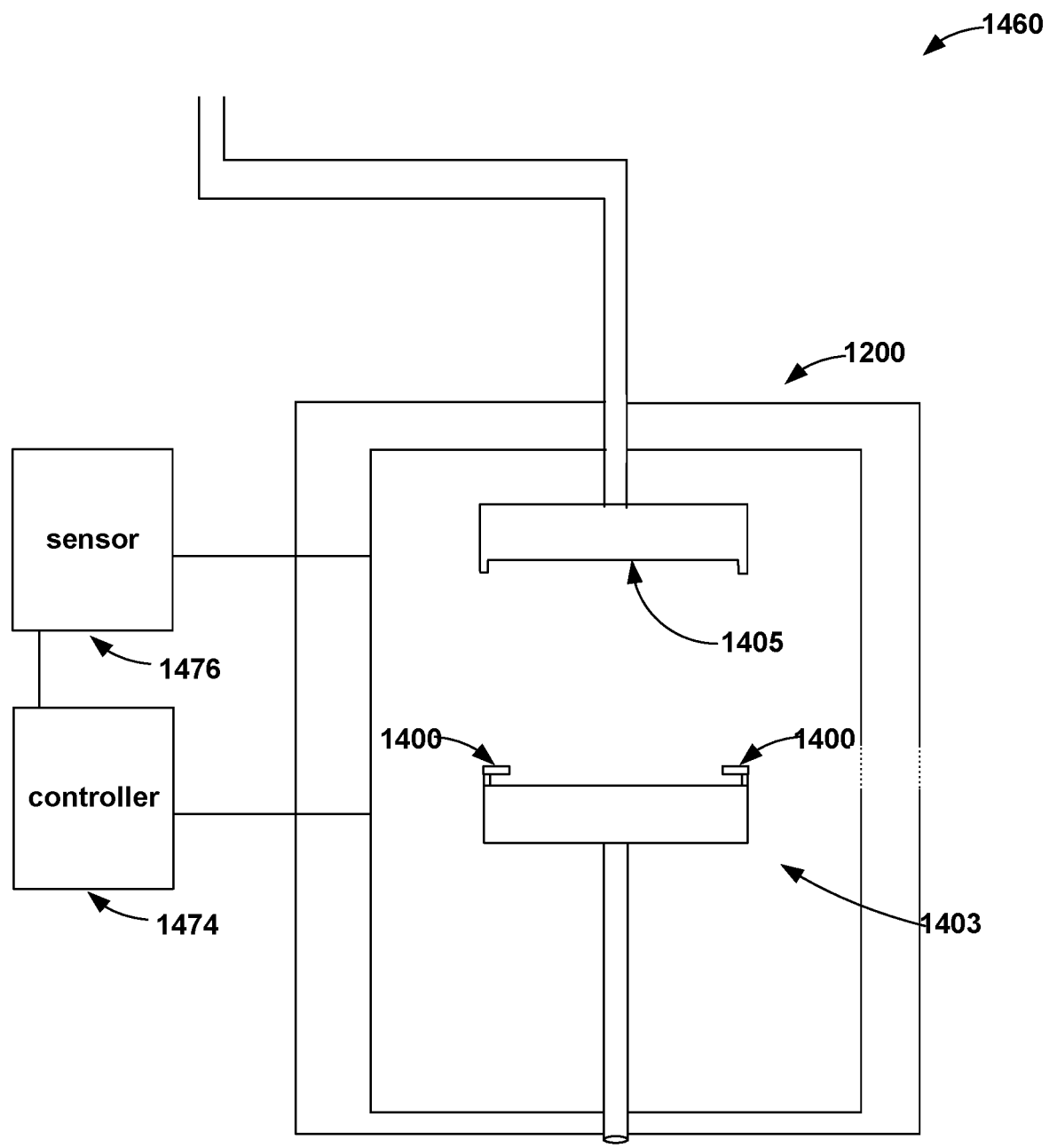
FIG. 14 is a schematic illustration of an example of a processing chamber suitable for deposition and treatment processes in accordance with implementations of the disclosure.

FIG. 14 shows an apparatus 1460 that may be used in accordance with various methods previously described. The deposition station 1400 has a substrate support 1403 that supports a wafer during deposition. An exclusion ring 1400 and showerhead 1405 are shown. As discussed above, a process gas may be fed through the showerhead 1405, with the substrate support equipped with a vacuum and, in some embodiments, a treatment gas source as shown above.

Gas sensors, pressure sensors, temperature sensors, etc. may be used to provide information on station conditions during various embodiments. Examples of station sensors that may be monitored during include mass flow controllers, pressure sensors such as manometers, thermocouples located in pedestal, and infra-red detectors to monitor the presence of a gas or gases in the station. In certain embodiments, a controller 1474 is employed to control process conditions of the station. Details on types of controllers are further discussed below with reference to FIG. 15 and the discussion with respect to this figure is applicable to the controller for the station as well as for the chamber. Sensors such as 1476 may be used to provide information to the controller 1474.

Figure 15:
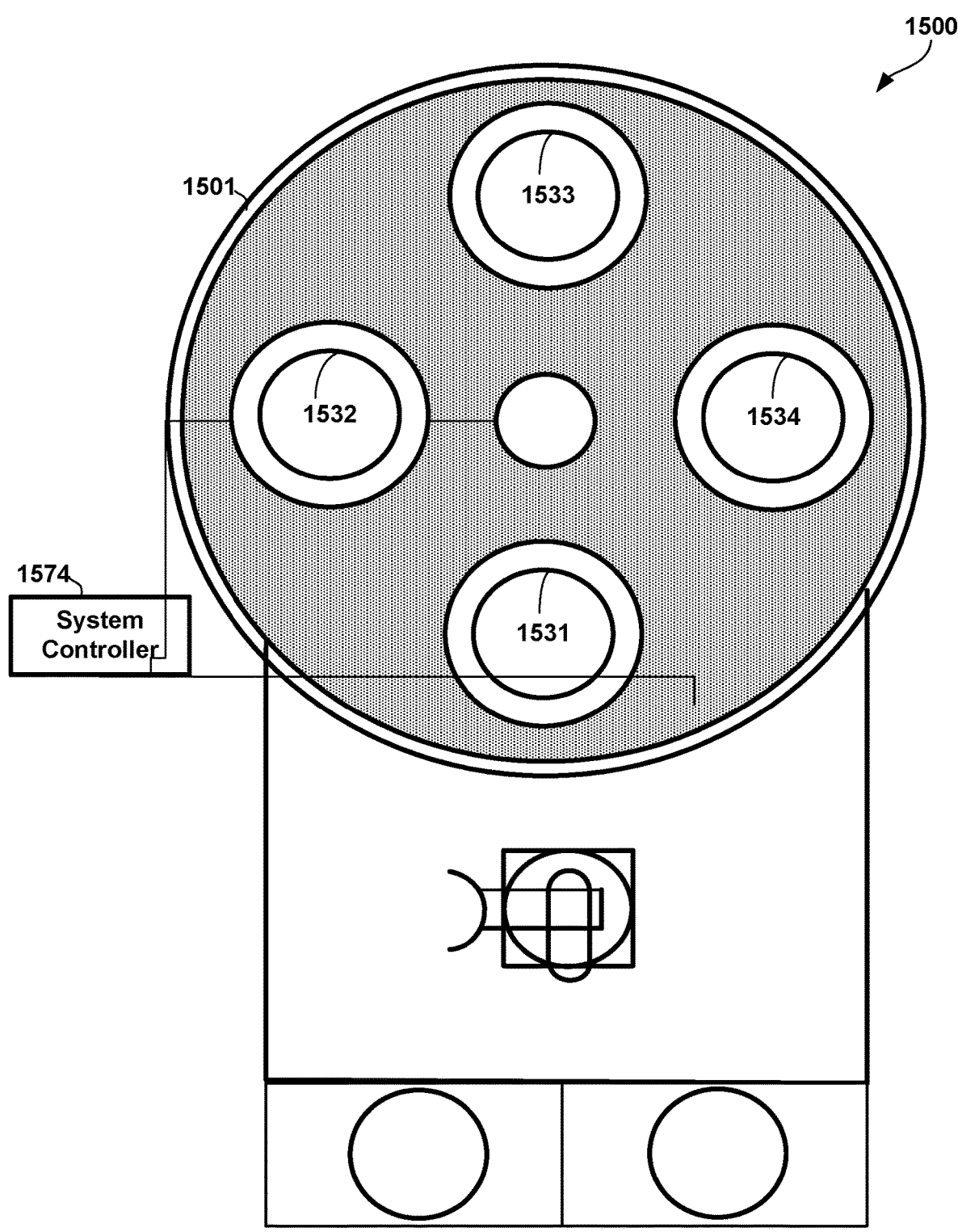
FIG. 15 is a schematic illustration of an example of a processing apparatus suitable for deposition and treatment processes in accordance with implementations of the disclosure.

FIG. 15 shows an example of a multi-station apparatus that may be used with certain embodiments. The apparatus 1500 includes a processing chamber 1501, which houses a number of stations. The processing chamber can house at least two stations, or at least three stations, or at least four stations or more. FIG. 15 shows an apparatus 1500 with four stations 1531, 1532, 1533, and 1534. In some embodiments, all stations in the multi-station apparatus 1500 with a processing chamber 1501 may be exposed to the same pressure environment controlled by the system controller 1574. Sensors (not shown) may also include a pressure sensor to provide chamber pressure readings. However, each station may have individual temperature conditions or other conditions.

In a deposition process, typically a wafer to be processed through a load-lock into the station 1531. At this station, a tungsten nucleation layer deposition process may be performed. The wafer then may be indexed to station 1532 for edge treatment as descried above. CVD deposition may then be performed at stations 1533 and 1534. Alternatively, one station may be reserved for edge etch.

A system controller 1574 can control conditions of the indexing, the stations, and the processing chamber, such as the pressure of the chamber. The system controller 1574 (which may include one or more physical or logical controllers) controls some or all of the operations of a process chamber 1500. The system controller 1574 may include one or more memory devices and one or more processors. In some implementations, the system controller 1574 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller, which may control various components or subparts of the system or systems. The system controller depending on the processing parameters and/or the type of system, may be programmed to control any of the processes disclosed herein, including the delivery of processing gases, temperature settings (e.g., heating and/or cooling), pressure settings, vacuum settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

We claim:
1. An apparatus comprising:
a semiconductor processing chamber having:
   an exclusion ring assembly configured for use in processing of a semiconductor wafer of nominal diameter D, the exclusion ring assembly comprising:
      an upper annular ring having an inner diameter smaller than D and an outer diameter, and
      a lower annular ring having an inner diameter smaller than D and an outer diameter, wherein the upper annular ring is disposed over the lower annular ring to define an annular gas flow passage between the upper annular ring and the lower annular ring,
   a pedestal having a top surface configured to support the semiconductor wafer, and
   a showerhead disposed over the pedestal and configured to flow a process gas onto the semiconductor wafer supported by the pedestal; and
a gas source fluidically connected to the showerhead and configured to flow the process gas to the showerhead; wherein:
   the apparatus is configured to apply a vacuum to the annular gas flow passage,
   the upper and lower annular rings are disposed over an outer edge of the semiconductor wafer,
   the exclusion ring assembly has an innermost axisymmetric opening extending circumferentially around a center axis of the exclusion ring assembly,
   the upper annular ring has a first innermost axisymmetric surface and a bottom frustoconical surface that intersects with the first innermost axisymmetric surface to form a first edge,
   the lower annular ring has a second innermost axisymmetric surface and a top frustoconical surface that faces the bottom frustoconical surface of the upper annular ring and that intersects with the second innermost axisymmetric surface to form a second edge,
   the first edge and the second edge define the innermost axisymmetric opening of the exclusion ring assembly, the annular gas flow passage terminates at the innermost opening such that the innermost axisymmetric opening forms an opening of the annular gas flow passage,
   the innermost axisymmetric opening is oriented at an acute angle or an obtuse angle with respect to the center axis of the exclusion ring assembly, and
   the annular gas flow passage and the pedestal are configured such that the vacuum applied to the annular gas flow passage while the process gas is flowed onto the semiconductor wafer causes the process gas to flow through the innermost axisymmetric opening and into the annular gas flow passage.

2. The apparatus of claim 1, wherein the annular gas flow passage has an inner diameter, and an outer diameter, and a width defined by a gap between the upper annular ring and the lower annular ring, and wherein the width at the inner diameter of the annular gas flow passage is less than the width at the outer diameter of the annular gas flow passage.

3. The apparatus of claim 1, wherein a gap between the upper annular ring and the lower annular ring at the inner diameter of the lower annular ring is smaller than the gap between the upper annular ring and the lower annular ring at the outer diameter of the lower annular ring.

4. The apparatus of claim 1, wherein a gap between the upper annular ring and the lower annular ring at the inner diameter of the lower annular ring is no more than 0.1 inch.

5. The apparatus of claim 1, wherein the inner diameter of the upper annular ring is smaller than the inner diameter of the lower annular ring.

6. The apparatus of claim 1, wherein the apparatus is without structures between the innermost axisymmetric opening and the center axis of the exclusion ring assembly.

7. The apparatus of claim 1, wherein the upper annular ring further comprises:
an upper frustoconical surface that intersects with the first innermost axisymmetric surface to form a third edge, and
an annular top surface that intersects with the upper frustoconical and that is substantially parallel to a reference plane perpendicular to the center axis of the exclusion ring assembly.

8. The apparatus of claim 7, wherein the lower annular ring comprises a top surface that intersects with the top frustoconical surface and that is substantially parallel to the reference plane.

9. The apparatus of claim 1, wherein the second edge is radially outwards of the first edge with respect to the center axis of the exclusion ring assembly.

10. The apparatus of claim 1, wherein the apparatus is configured such that gas flows from the substrate and enters the annular gas flow passage through the innermost opening without flowing through another structure.

11. The apparatus of claim 1, wherein the pedestal further comprises a gas injector configured to inject gas at an edge region of the semiconductor wafer.

12. The apparatus of claim 1, wherein the pedestal further comprises a recess in the top surface defining a gas passage.

13. The apparatus of claim 1, wherein the first innermost axisymmetric surface and the second innermost axisymmetric surface are parallel to the center axis.

14. An apparatus comprising:
a deposition chamber including:
a pedestal comprising a top surface and an annular recess in the top surface configured to be fluidically connected to a backside gas source;
an exclusion ring assembly installed on the pedestal, wherein the exclusion ring assembly comprises an upper annular ring having an inner diameter and an outer diameter and a lower annular ring having an inner diameter and an outer diameter, wherein the upper annular ring is disposed over the lower annular ring to define a lower annular gas flow passage between the upper annular ring and the lower annular ring; and
a showerhead disposed over the pedestal and exclusion ring assembly to define an upper annular gas flow passage between the showerhead and the upper annular ring;
wherein:
the upper and lower annular rings are disposed over an outer edge of a substrate positioned on the pedestal,
the pedestal and the exclusion ring assembly are capable of being raised to decrease the size of the upper annular gas flow passage,
the pedestal and the exclusion ring assembly are further capable of being lowered to increase the size of the upper annular gas flow passage, so as to provide control over the processing gas concentration,
the exclusion ring assembly has an innermost axisymmetric opening extending circumferentially around a center axis of the exclusion ring assembly, the upper annular ring has a first innermost axisymmetric surface and a bottom frustoconical surface that intersects with the first innermost axisymmetric surface to form a first edge,
the lower annular ring has a second innermost axisymmetric surface and a top frustoconical surface that faces the bottom frustoconical surface of the upper annular ring and that intersects with the second innermost axisymmetric surface to form a second edge,
the first edge and the second edge define the innermost axisymmetric opening of the exclusion ring assembly, the annular gas flow passage terminates at the innermost opening such that the innermost axisymmetric opening forms an opening of the annular gas flow passage, and the innermost axisymmetric opening is oriented at an acute angle or an obtuse angle with respect to the center axis of the exclusion ring assembly.

15. The apparatus of claim 1, further comprising a controller configured to cause:
the process gas to flow to the showerhead and onto the semiconductor wafer, and
the vacuum to be applied to the annular gas flow passage while the process gas is flowed onto the semiconductor wafer.

16. The apparatus of claim 1, wherein the vacuum is an outward radial vacuum.

17. The apparatus of claim 1, wherein the apparatus is without structures between the innermost axisymmetric opening and the center axis of the exclusion ring assembly.

* * * * *